(12) United States Patent
Inagaki

(10) Patent No.: US 10,112,205 B2
(45) Date of Patent: Oct. 30, 2018

(54) SUBSTRATE PROCESSING APPARATUS AND SUBSTRATE PROCESSING METHOD

(71) Applicant: SCREEN HOLDINGS CO., LTD., Kyoto (JP)

(72) Inventor: Yukihiko Inagaki, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 159 days.

(21) Appl. No.: 15/223,730

(22) Filed: Jul. 29, 2016

(65) Prior Publication Data

US 2017/0050211 A1 Feb. 23, 2017

(30) Foreign Application Priority Data

Aug. 18, 2015 (JP) ................................ 2015-161329

(51) Int. Cl.
*B05B 12/14* (2006.01)
*B05B 9/03* (2006.01)
(Continued)

(52) U.S. Cl.
CPC .............. *B05B 9/03* (2013.01); *B05C 5/0204* (2013.01); *B05C 5/0208* (2013.01); *B05D 1/005* (2013.01);
(Continued)

(58) Field of Classification Search
CPC ................ B05C 5/0204; B05C 5/0208; H01L 21/67178; H01L 21/681; H01L 21/6715;
(Continued)

(56) References Cited

U.S. PATENT DOCUMENTS 6,320,937 B1 11/2001 Mochizuki .................... 378/143
7,153,087 B2 * 12/2006 Kang ................ H01L 21/67259
414/781

(Continued)

FOREIGN PATENT DOCUMENTS

JP 2005-203440 7/2005
KR 10-2004-0104421 A 12/2004
(Continued)

OTHER PUBLICATIONS

Decision to Grant dated Aug. 28, 2017 issued in corresponding Korean Patent Application No. 10-2016-0092585.
Decision to Grant dated Aug. 30, 2017 issued in corresponding Taiwan Patent Application No. 105117845.

*Primary Examiner* — Laura Edwards
(74) *Attorney, Agent, or Firm* — Ostrolenk Faber LLP

(57) ABSTRACT

A substrate is transported to a coating processing unit. An annular region of one surface of the substrate is processed. The substrate is carried into an edge exposure unit. Positions of a peripheral edge of the substrate and an inner edge of the annular region are detected. A position deviation amount of a center of the substrate held by a spin chuck from a rotation center of the spin chuck is calculated. Based on schedule management information, a relationship between orientations of the substrate held by the spin chuck at the time of carrying of the substrate into the coating processing unit and the substrate held by the substrate rotation unit at the time of carrying of the substrate into the edge exposure unit is specified. Based on the relationship, a position deviation direction of the center of the substrate from the rotation center is determined.

8 Claims, 19 Drawing Sheets

(51) Int. Cl.
  *B05C 5/02*   (2006.01)
  *H01L 21/67*  (2006.01)
  *G03F 9/00*   (2006.01)
  *B05D 1/00*   (2006.01)
  *H01L 21/68*  (2006.01)
  *B05D 1/02*   (2006.01)

(52) U.S. Cl.
  CPC .......... *G03F 9/7011* (2013.01); *G03F 9/7019* (2013.01); *H01L 21/6715* (2013.01); *H01L 21/67126* (2013.01); *H01L 21/67178* (2013.01); *H01L 21/681* (2013.01); *B05B 12/1454* (2013.01)

(58) Field of Classification Search
  CPC . H01L 21/67126; B05B 9/03; B05B 12/1454; B05D 1/005; G03F 7/708; G03F 9/7011; G03F 9/7019
  USPC .... 118/708, 712, 52, 56, 320; 396/564, 604; 134/902
  See application file for complete search history.

(56) References Cited

U.S. PATENT DOCUMENTS

| | | | |
|---|---|---|---|
| 8,654,325 B2 | 2/2014 | Nakamizo et al. | 356/237.2 |
| 2001/0053291 A1* | 12/2001 | Fujita | G03F 7/70716 396/564 |
| 2005/0016818 A1 | 1/2005 | Ito et al. | 198/345.1 |
| 2005/0150451 A1 | 7/2005 | Tanaka et al. | 118/688 |
| 2008/0013089 A1* | 1/2008 | Ishii | G03F 9/7011 356/400 |
| 2008/0226830 A1 | 9/2008 | Miyagi et al. | 427/402 |
| 2012/0037593 A1 | 2/2012 | Miyagi et al. | 216/37 |
| 2013/0084393 A1 | 4/2013 | Kashiyama et al. | 427/273 |
| 2015/0174763 A1 | 6/2015 | Kimura et al. | 700/259 |
| 2016/0203997 A1 | 7/2016 | Miyagi et al. | 216/37 |

FOREIGN PATENT DOCUMENTS

| | | |
|---|---|---|
| KR | 10-2008-0021524 A | 3/2008 |
| KR | 10-2013-0035186 A | 4/2013 |
| KR | 10-2015-0072347 A | 6/2015 |

* cited by examiner

F I G. 8
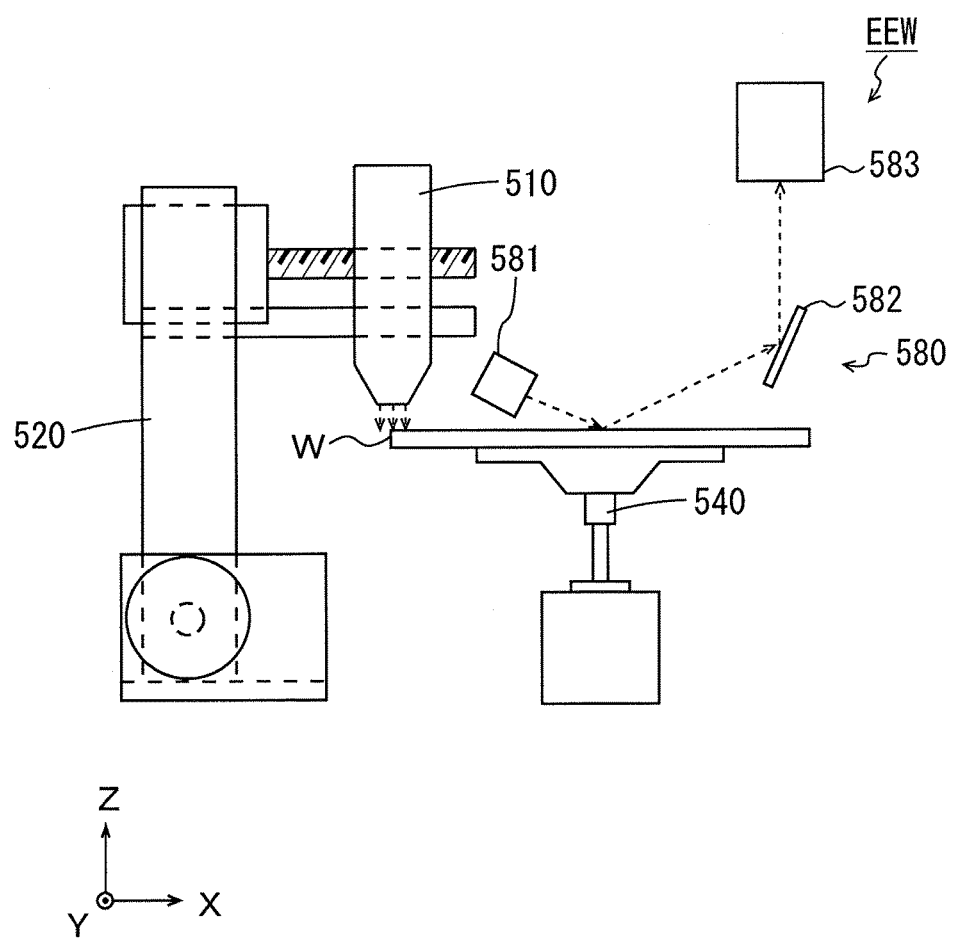

F I G. 9
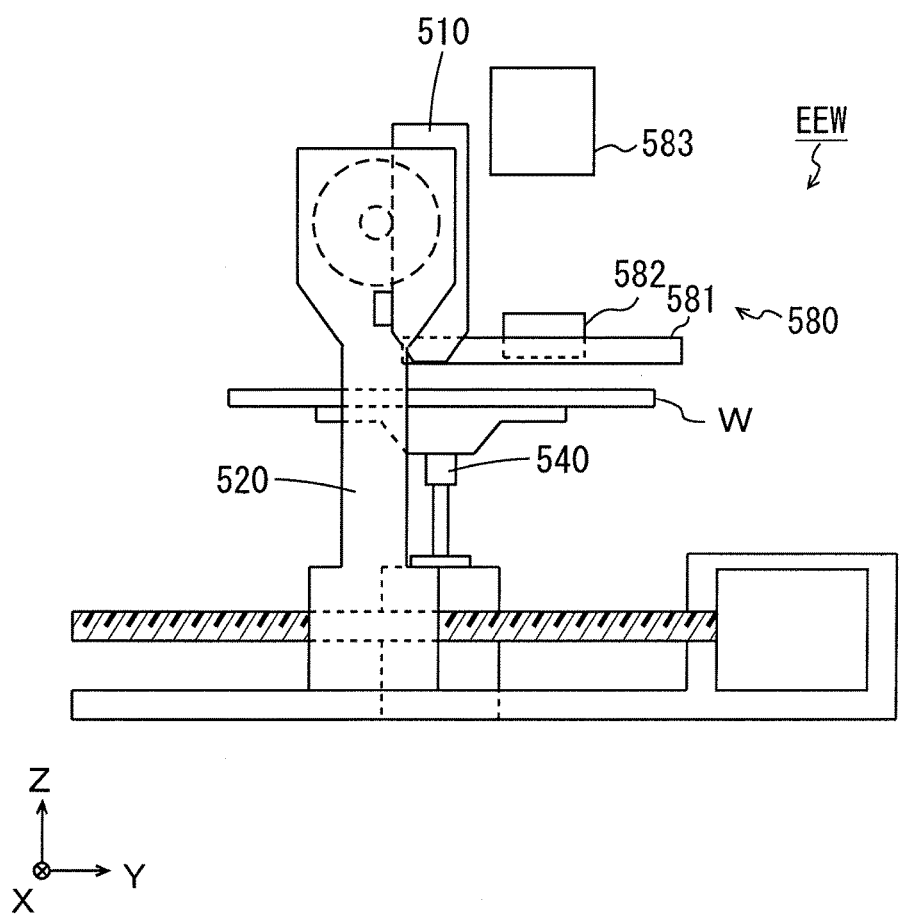

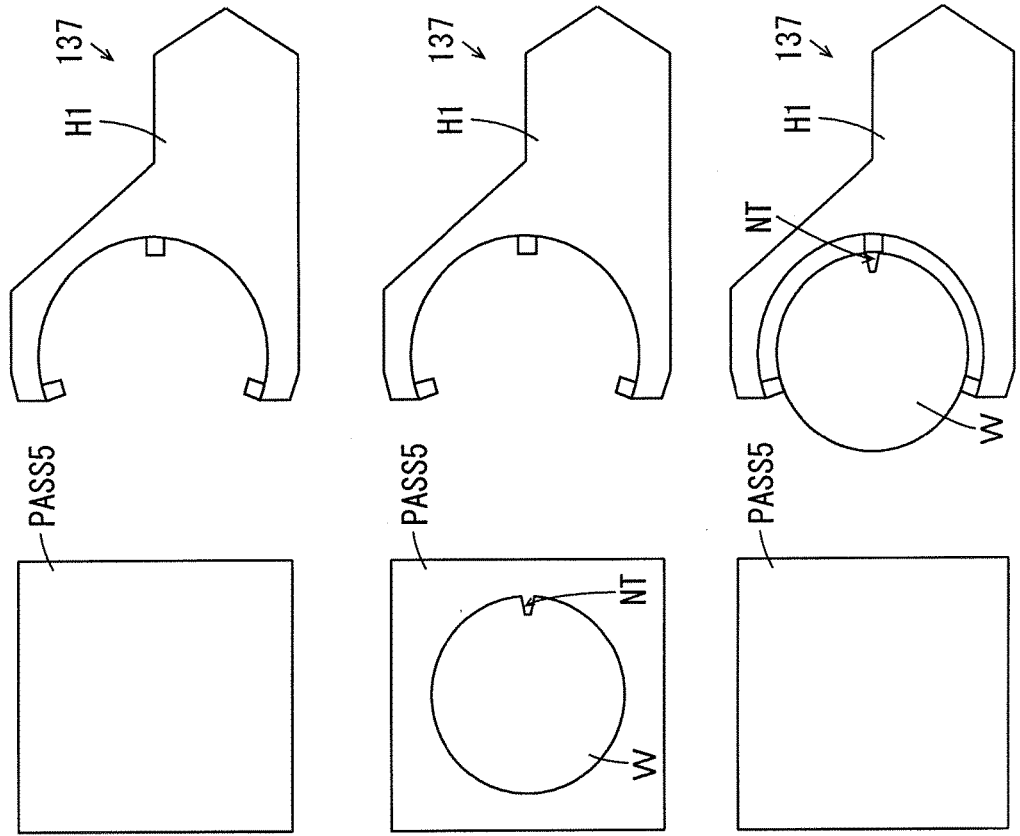
FIG. 13A
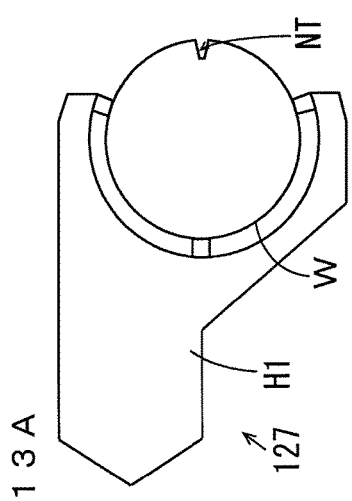
FIG. 13B
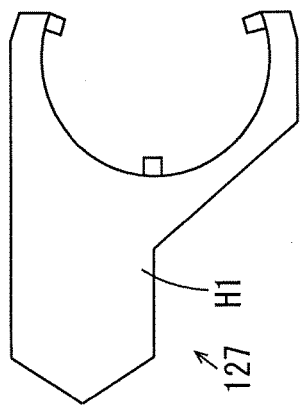
FIG. 13C
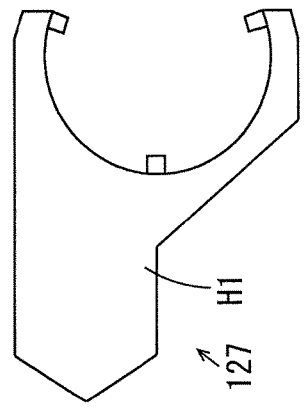

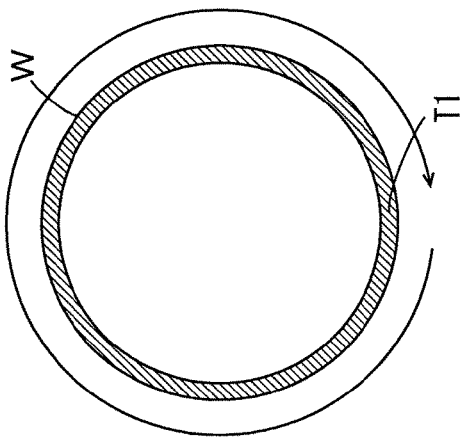
F I G. 15A
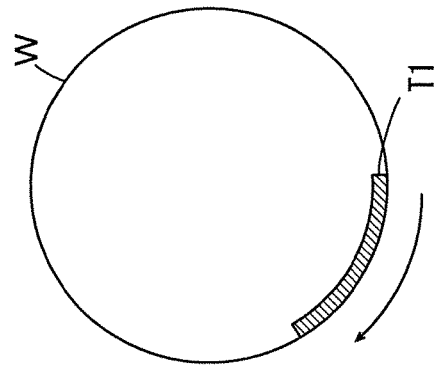
F I G. 15B
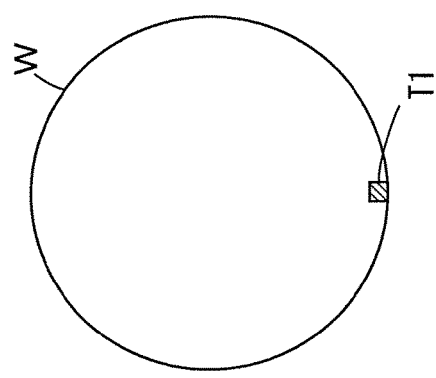
F I G. 15C
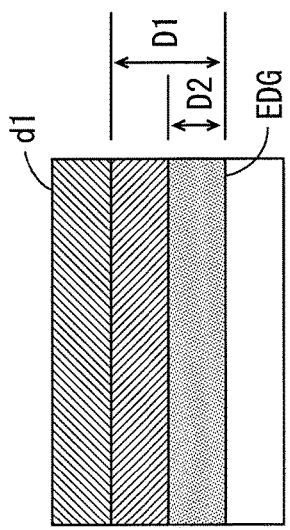
F I G. 15D
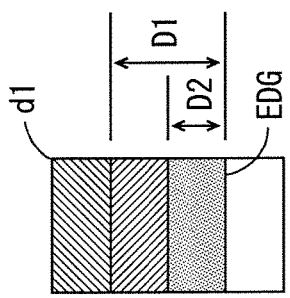
F I G. 15E
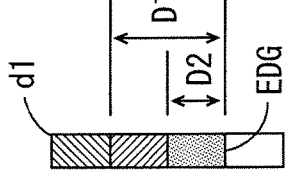
F I G. 15F

SUBSTRATE PROCESSING APPARATUS AND SUBSTRATE PROCESSING METHOD

BACKGROUND OF THE INVENTION

Field of the Invention

The present invention relates to a substrate processing apparatus and a substrate processing method for performing substrate processing using a processing liquid.

Description of Related Art

In a substrate processing apparatus, a substrate horizontally supported by a spin chuck is rotated. In this state, a coating film is formed on a surface of the substrate by discharge of a coating liquid from a nozzle to substantially the center of an upper surface of the substrate. In the case where the coating film is formed at a peripheral portion of the substrate, when a transport mechanism that transports the substrate holds the peripheral portion of the substrate, the film is stripped and becomes particles. In order to prevent the coating film from being formed at the peripheral portion of the substrate, a removal liquid that removes the coating liquid is supplied to the peripheral portion of the substrate after the coating liquid is supplied to the entire surface of the substrate (see JP 2005-203440 A, for example).

In a substrate processing system described in JP 2005-203440 A, a resist film is formed on the surface of the substrate by a resist coating device, and a resist film at the peripheral portion of the substrate is removed. Thereafter, the substrate is transported to a defect detection device. In the defect detection device, an image of the surface of the substrate is picked up. A width of a removal region of the resist film is measured from a piece of acquired image data. A position deviation of a holding position of the substrate in the resist coating device is calculated from the measured width. The holding position of the substrate can be adjusted (centering adjustment) based on the calculated position deviation.

BRIEF SUMMARY OF THE INVENTION

In JP 2005-203440 A, it is described that "the centering adjustment can be performed by a simple method" by the above-mentioned configuration. However, an orientation of the holding position of the substrate to be adjusted in the defect detection device and an orientation of the holding position of the substrate to be adjusted in the resist coating device are not necessarily equal to each other. Therefore, in practice, the centering adjustment cannot be easily performed in the resist coating device only by the position deviation acquired from the defect detection device.

An object of the present invention is to provide a substrate processing apparatus in which and a substrate processing method by which a rotation center of a substrate and a geometric center of the substrate can easily coincide with each other.

(1) A substrate processor according to one aspect of the present invention includes a transport robot that holds and transports a substrate having an at least partially circular outer periphery, a substrate processor that performs processing on the substrate using a processing liquid, a detector that detects a state of the substrate, and a controller that controls operations of the transport robot, the substrate processor and the detector, based on pieces of schedule management information including a transport path of the substrate by the transport robot and contents of processing for the substrate, wherein the transport robot transports the substrate along the transport path, carries in the substrate to the substrate processor, carries out the substrate after processing from the substrate processor, and carries in the substrate after processing by the substrate processor to the detector, the substrate processor includes a rotation holder that holds and rotates the substrate carried in by the transport robot, and a processing liquid supplier that performs processing on an annular region of one surface by supplying the processing liquid to a peripheral portion of the one surface of the substrate rotated by the rotation holder, the detector includes a substrate holder that holds the substrate carried in by the transport robot, and a position detector that detects a position of a peripheral edge of the substrate held by the substrate holder and a position of an inner edge of the annular region of the substrate held by the substrate holder, the controller includes a position deviation amount calculator that calculates a position deviation amount of a center of the substrate held by the rotation holder from a rotation center of the rotation holder, based on the position of the peripheral edge of the substrate detected by the position detector and the position of the inner edge of the annular region of the substrate detected by the position detector, a position deviation direction determiner that specifies a relationship between an orientation of the substrate held by the rotation holder at a time of carrying of the substrate into the substrate processor by the transport robot and an orientation of the substrate held by the substrate holder at a time of carrying of the substrate into the detector by the transport robot, based on the pieces of schedule management information, and determines a position deviation direction of the center of the substrate held by the rotation holder from the rotation center of the rotation holder, based on the specified relationship, and an adjustor that adjusts a carry-in operation of the substrate to the substrate processor by the transport robot such that a center of the substrate carried into the substrate processor after calculation of the position deviation amount and determination of the position deviation direction coincides with the rotation center of the rotation holder, based on the calculated position deviation amount and the determined position deviation direction.

In this substrate processing apparatus, the substrate is transported by the transport robot and the substrate is carried into the substrate processor, along the transport path included in the pieces of schedule management information. In the substrate processor, based on the contents of processing for the substrate included in the pieces of schedule management information, the substrate carried in by the transport robot is held and rotated by the rotation holder, and the processing liquid is supplied to the peripheral portion of the one surface of the substrate by the processing liquid supplier. Thus, processing is performed on the annular region of the one surface of the substrate.

Thereafter, the substrate after processing is carried out from the substrate processor by the transport robot and the substrate after processing by the substrate processor is carried into the detector, along the transport path included in the pieces of schedule management information. In the detector, based on the contents of processing for the substrate included in the pieces of schedule management information, the substrate carried in by the transport robot is held by the substrate holder, and the position of the peripheral edge of the substrate and the position of the inner edge of the annular region of the substrate are detected by the position detector.

Based on the position of the peripheral edge of the substrate detected by the position detector and the position of the inner edge of the annular region of the substrate detected by the position detector, the position deviation amount of the center of the substrate held by the rotation holder from the rotation center of the rotation holder is calculated. Based on the pieces of schedule management information, the relationship between the orientation of the substrate held by the rotation holder at the time of carrying of the substrate into the substrate processor by the transport robot and the orientation of the substrate held by the substrate holder at the time of carrying of the substrate into the detector by the transport robot is specified. Based on the specified relationship, the position deviation direction of the center of the substrate held by the rotation holder from the rotation center of the rotation holder is determined.

Based on the calculated position deviation amount and the determined position deviation direction, the carry-in operation of the substrate to the substrate processor by the transport robot is adjusted such that the center of the substrate carried into the substrate processor after the calculation of the position deviation amount and the determination of the position deviation direction coincides with the rotation center of the rotation holder.

In the above-mentioned configuration, based on the pieces of schedule management information, the relationship between the orientation of the substrate held by the rotation holder at the time of carrying of the substrate into the substrate processor and the orientation of the substrate held by the substrate holder at the time of carrying of the substrate into the detector is specified. Therefore, even in the case where the orientation of the substrate held by the rotation holder at the time of carrying of the substrate into the substrate processor and the orientation of the substrate held by the substrate holder at the time of carrying of the substrate into the detector do not coincide with each other, the carry-in operation of the substrate to the substrate processor by the transport robot can be adjusted such that the center of the substrate coincides with the rotation center of the rotation holder. As a result, the rotation center of the substrate and the geometric center of the substrate can easily coincide with each other.

(2) The substrate holder may be configured to hold and rotate the substrate in a horizontal attitude, the controller may further include a rotation controller that controls the substrate holder such that the substrate held by the substrate holder makes at least a full revolution, and the position detector may detect the position of the peripheral edge of the substrate rotated by the substrate holder and the position of the inner edge of the annular region of the substrate rotated by the substrate holder.

In this case, the entire peripheral portion of the one surface of the substrate can be detected using a small-size position detector. Thus, the size of the detector can be reduced.

(3) A position determiner for specifying an orientation of the substrate may be formed at the substrate, the position detector may detect a position of the position determiner of the substrate, and the rotation controller may control a rotation angle of the substrate holder based on a change of the position of the position determiner of the substrate detected by the position detector.

In this case, the rotation angle of the substrate holder can be easily detected based on the position determiner of the substrate. Therefore, it is not necessary to add a member such as an encoder for detecting the rotation angle of the substrate holder to the detector. Thus, an increase in cost of the substrate processing apparatus can be inhibited.

(4) The position detector may include an image data detector that detects pieces of image data indicating the position of the peripheral edge of the substrate rotated by the substrate holder and the position of the inner edge of the annular region of the substrate rotated by the substrate holder, and the position deviation amount calculator may detect a change of the position of the peripheral edge of the substrate in a radial direction of the substrate and a change of the position of the inner edge of the annular region of the substrate in the radial direction of the substrate, based on the pieces of image data detected by the image data detector, and calculates the position deviation amount of the center of the substrate, based on the detected change of the position of the peripheral edge of the substrate and the detected change of the position of the inner edge of the annular region of the substrate.

In this case, based on the pieces of image data detected by the image data detector, the change of the position of the peripheral edge of the substrate in the radial direction of the substrate and the change of the position of the inner edge of the annular region of the substrate in the radial direction of the substrate are detected. Based on the detected change of the position of the peripheral edge of the substrate and the detected change of the position of the inner edge of the annular region of the substrate, the position deviation amount of the center of the substrate is calculated. Thus, the position deviation amount between the rotation center of the substrate and the geometric center of the substrate can be easily calculated using the image processing.

(5) The position deviation amount calculator may calculate a width of the annular region in the radial direction of the substrate, based on the change of the position of the peripheral edge of the substrate in the radial direction of the substrate and the change of the position of the inner edge of the annular region of the substrate in the radial direction of the substrate, and may calculate the position deviation amount of the center of the substrate, based on the calculated width.

In this case, based on the change of the position of the periphery edge of the substrate in the radial direction of the substrate and the change of the position of the inner edge of the annular region of the substrate in the radial direction of the substrate, the width of the annular region of the substrate in the radial direction is calculated. Based on the calculated width, the position deviation amount of the center of the substrate is calculated. Thus, the position deviation amount between the rotation center of the substrate and the geometric center of the substrate can be more easily calculated.

(6) The substrate processor may further include a coating liquid supplier that supplies a coating liquid for forming a coating film on the substrate rotated by the rotation holder, the processing liquid supplier may supply a removal liquid that removes the coating liquid on the substrate supplied by the coating liquid supplier to the peripheral portion of the one surface of the substrate as the processing liquid, and the annular region may be an annular region from which the coating liquid on the substrate is removed. In this case, the substrate processor can perform the substrate processing for removing the coating liquid applied to the peripheral portion of the one surface of the substrate.

(7) The coating liquid supplier may supply a coating liquid for forming a photosensitive coating film, the substrate processing apparatus may further include a peripheral exposer that exposes the coating film at the peripheral portion of the one surface of the substrate, the coating film being formed by the coating liquid supplier, and the detector may be provided at the peripheral exposer.

In this case, in the peripheral portion exposer, the state of the substrate is detected, and the coating film at the peripheral portion of the one surface of the substrate is exposed.

Therefore, the coating film at the peripheral portion of the one surface of the substrate can be exposed while an increase in size of the substrate processing apparatus and an increase in footprint are prevented.

(8) The processing liquid supplier may supply a coating liquid for forming a coating film on the substrate to the peripheral portion of the one surface of the substrate as the processing liquid, and the annular region may be an annular region on which the coating film is formed on the substrate. In this case, the substrate processor can perform the substrate processing for forming the coating film at the peripheral portion of the one surface of the substrate.

(9) A substrate processing method according to another aspect of the present invention includes the steps of acquiring pieces of schedule management information that include a transport path of a substrate and contents of processing for the substrate, transporting the substrate by a transport robot and carrying in the substrate to a substrate processor along the transport path included in the pieces of acquired schedule management information, holding and rotating the substrate carried in by the transport robot by the rotation holder and supplying a processing liquid to a peripheral portion of one surface of the substrate to perform processing on an annular region of the substrate in the substrate processor, based on the contents of processing for the substrate included in the pieces of schedule management information, carrying out the substrate after processing from the substrate processor by a transport robot and carrying in the substrate after processing by the substrate processor to the detector by a transport robot along the transport path included in the pieces of schedule management information, holding the substrate carried in by the transport robot by the substrate holder and detecting a position of a peripheral edge of the substrate and a position of an inner edge of the annular region of the substrate by a position detector, in the detector, based on the contents of processing for the substrate included in the pieces of schedule management information, calculating a position deviation amount of a center of the substrate held by the rotation holder from a rotation center of the rotation holder, based on the position of the peripheral edge of the substrate detected by the position detector and the position of the inner edge of the annular region of the substrate detected by the position detector, specifying a relationship between an orientation of the substrate held by the rotation holder at a time of carrying the substrate into the substrate processor by the transport robot and an orientation of the substrate held by the substrate holder at a time of carrying the substrate into the detector by the transport robot, based on the pieces of schedule management information, and determining a position deviation direction of the center of the substrate held by the rotation holder from the rotation center of the rotation holder, based on the specified relationship, and adjusting a carry-in operation of the substrate to the substrate processor by the transport robot such that the center of the substrate carried into the substrate processor after calculation of the position deviation amount and determination of the position deviation direction coincides with the rotation center of the rotation holder, based on the calculated position deviation amount and the determined position deviation direction.

In this substrate processing method, the substrate is transported by the transport robot and the substrate is carried into the substrate processor, along the transport path included in the pieces of schedule management information. In the substrate processor, based on the contents of processing of the substrate included in the pieces of schedule management information, the substrate carried in by the transport robot is held and rotated by the rotation holder, and the processing liquid is supplied to the peripheral portion of the one surface of the substrate by the processing liquid supplier. Thus, the processing is performed on the annular region of the one surface of the substrate.

Thereafter, the substrate after processing is carried out from the substrate processor by the transport robot and the substrate after processing by the substrate processor is carried into the detector, along the transport path included in the pieces of schedule management information. In the detector, based on the contents of processing for the substrate included in the pieces of schedule management information, the substrate carried in by the transport robot is held by the substrate holder, and the position of the peripheral portion of the substrate and the position of the inner edge of the annular region of the substrate are detected by the position detector.

Based on the position of the peripheral edge of the substrate detected by the position detector and the position of the inner edge of the annular region of the substrate detected by the position detector, the position deviation amount of the center of the substrate held by the rotation holder from the rotation center of the rotation holder is calculated. Based on the pieces of schedule management information, the relationship between the orientation of the substrate held by the rotation holder at the time of carrying of the substrate to the substrate processor by the transport robot and the orientation of the substrate held by the substrate holder at the time of carrying of the substrate into the detector by the transport robot is specified. Based on the specified relationship, the position deviation direction of the center of the substrate held by the rotation holder from the rotation center of the rotation holder is determined.

Based on the calculated position deviation amount and the determined position deviation direction, the carry-in operation of the substrate to the substrate processor by the transport robot is adjusted such that the center of the substrate carried into the substrate processor after the calculation of the position deviation amount and the determination of the position deviation direction coincides with the rotation center of the rotation holder.

In the above-mentioned method, based on the pieces of schedule management information, the relationship between the orientation of the substrate held by the rotation holder at the time of carrying of the substrate into the substrate processor, and the orientation of the substrate held by the substrate holder at the time of carrying of the substrate into the detector is specified. Therefore, even in the case where the orientation of the substrate held by the rotation holder at the time of carrying of the substrate into the substrate processor and the orientation of the substrate held by the substrate holder at the time of carrying of the substrate into the detector, the carry-in operation of the substrate to the substrate processor by the transport robot can be adjusted such that the center of the substrate coincides with the rotation center of the rotation holder. As a result, the rotation center of the substrate and the geometric center of the substrate can easily coincide with each other.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWING

FIG. 8 is a diagram schematically showing one side surface of an edge exposure unit;

FIG. 9 is a diagram schematically showing another side surface of the edge exposure unit;

FIGS. 13A to 13C are diagrams for explaining receiving and transferring of the substrate between the transport mechanisms;

FIGS. 15A to 15F are diagrams for explaining a method of producing pieces of peripheral portion image data;

DESCRIPTION OF THE PREFERRED EMBODIMENTS (1) Substrate Processing Apparatus

A substrate processing apparatus and a substrate processing method according to one embodiment of the present invention will be described below with reference to drawings. In the following description, a substrate refers to a semiconductor substrate, a substrate for a liquid crystal display device, a substrate for a plasma display, a substrate for an optical disc, a substrate for a magnetic disc, a substrate for a magneto-optical disc, a substrate for a photomask or the like. Further, the substrate used in the present embodiment has an at least partially circular outer periphery. For example, an outer periphery except for a notch for positioning is circular.

Figure 1:
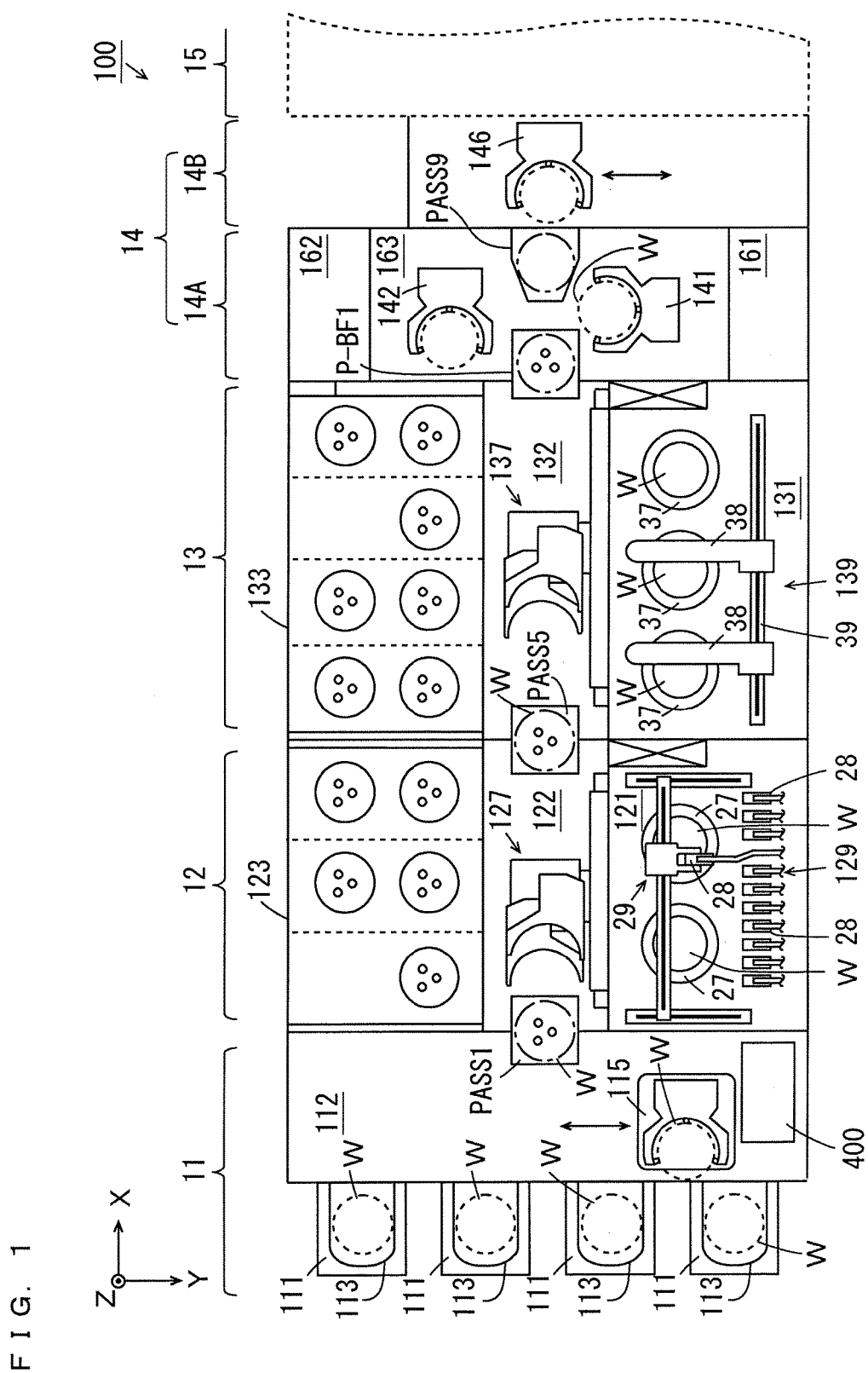
FIG. 1 is a schematic plan view of a substrate processing apparatus according to one embodiment of the present invention.

FIG. 1 is a schematic plan view of the substrate processing apparatus according to one embodiment of the present invention. FIG. 1 and the subsequent drawings are accompanied by the arrows that indicate X, Y, and Z directions orthogonal to one another for the clarity of a positional relationship. The X and Y directions are orthogonal to each other within a horizontal plane, and the Z direction corresponds to a vertical direction.

As shown in FIG. 1, the substrate processing apparatus 100 includes an indexer block 11, a coating block 12, a development block 13, a cleaning drying processing block 14A and a carry-in carry-out (indexer) block 14B. An interface block 14 is constituted by the cleaning drying processing block 14A and the carry-in carry-out block 14B. An exposure device (an exposer) 15 is arranged to be adjacent to the carry-in carry-out block 14B.

The indexer block 11 includes a plurality of carrier platforms 111 and a transport section (a transport space) 112. In each carrier platform 111, a carrier 113 for storing the plurality of substrates W in multiple stages is placed. In the transport section 112, a main controller 400 and a transport mechanism (a transport robot) 115 are provided. The main controller 400 controls various constituent elements of the substrate processing apparatus 100. The transport mechanism 115 holds and transports the substrate W.

The coating block 12 includes a coating processing section (a coating processing space) 121, a transport section (a transport space) 122 and a thermal processing section (a thermal processing space) 123. The coating processing section 121 and the thermal processing section 123 are opposite to each other with the transport section 122 sandwiched therebetween. Substrate platforms PASS1 to PASS4 (see FIG. 11) on which the substrates W are placed are provided between the transport section 122 and the indexer block 11. Transport mechanisms (transport robots) 127, 128 (see FIG. 11), which transport the substrates W, are provided in the transport section 122.

The development block 13 includes a development processing section (a development processing space) 131, a transport section (a transport space) 132 and a thermal processing section (a thermal processing space) 133. The development processing section 131 and the thermal processing section 133 are opposite to each other with the transport section 132 sandwiched therebetween. Substrate platforms PASS5 to PASS8 (see FIG. 11) on which the substrates Ware placed are provided between the transport section 132 and the transport section 122. Transport mechanisms (transport robots) 137, 138 (see FIG. 11), which transport the substrates W, are provided in the transport section 132.

The cleaning drying processing block 14A includes cleaning drying processing sections (cleaning drying processing spaces) 161, 162 and a transport section (a transport space) 163. The cleaning drying processing sections 161, 162 are opposite to each other with the transport section 163 sandwiched therebetween. Transport mechanisms (transport robots) 141, 142 are provided in the transport section 163.

Placement buffer units P-BF1, P-BF2 (see FIG. 11) are provided between the transport section 163 and the transport section 132. The placement buffer units P-BF1, P-BF2 are configured to be capable of storing the plurality of substrates W.

Further, a substrate platform PASS9, and placement cooling platforms P-CP (see FIG. 11) that are described below are provided to be adjacent to the carry-in carry-out block 14B between the transport mechanisms 141, 142. Each placement cooling platform P-CP includes a function of cooling the substrate W (a cooling plate, for example). In the placement cooling platform P-CP, the substrate W is cooled to a temperature suitable for exposure processing. A transport mechanism (a transport robot) 146 is provided in the carry-in carry-out block 14B. The transport mechanism 146 carries in the substrate W to and carries out the substrate W from the exposure device 15.

(2) Coating Processing Section and Development Processing Section

Figure 2:
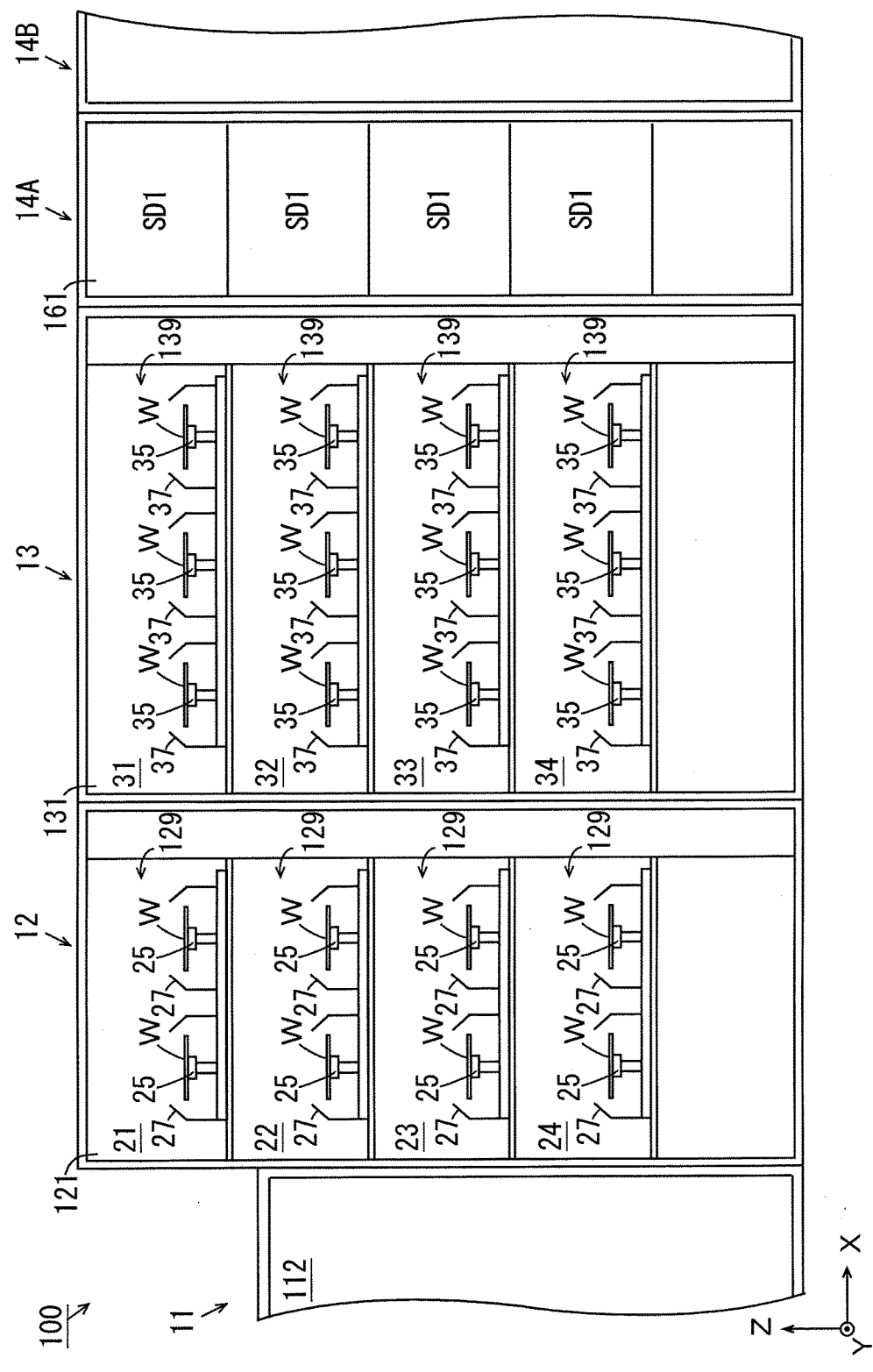
FIG. 2 is a schematic side view showing the inner configuration of each of a coating processing section, a development processing section, and a cleaning drying processing section of FIG. 1.

FIG. 2 is a schematic side view showing the inner configuration of the coating processing section 121, the development processing section 131 and the cleaning drying processing section 161 of FIG. 1. As shown in FIG. 2, in the coating processing section 121, coating processing chambers 21, 22, 23, 24 are provided in a stack. In each coating processing chamber 21 to 24, a coating processing unit (a coater) 129 is provided. In the development processing section 131, development processing chambers 31, 32, 33, 34 are provided in a stack. In each of the development processing chambers 31 to 34, a development processing unit (a developer) 139 is provided.

Figure 3:
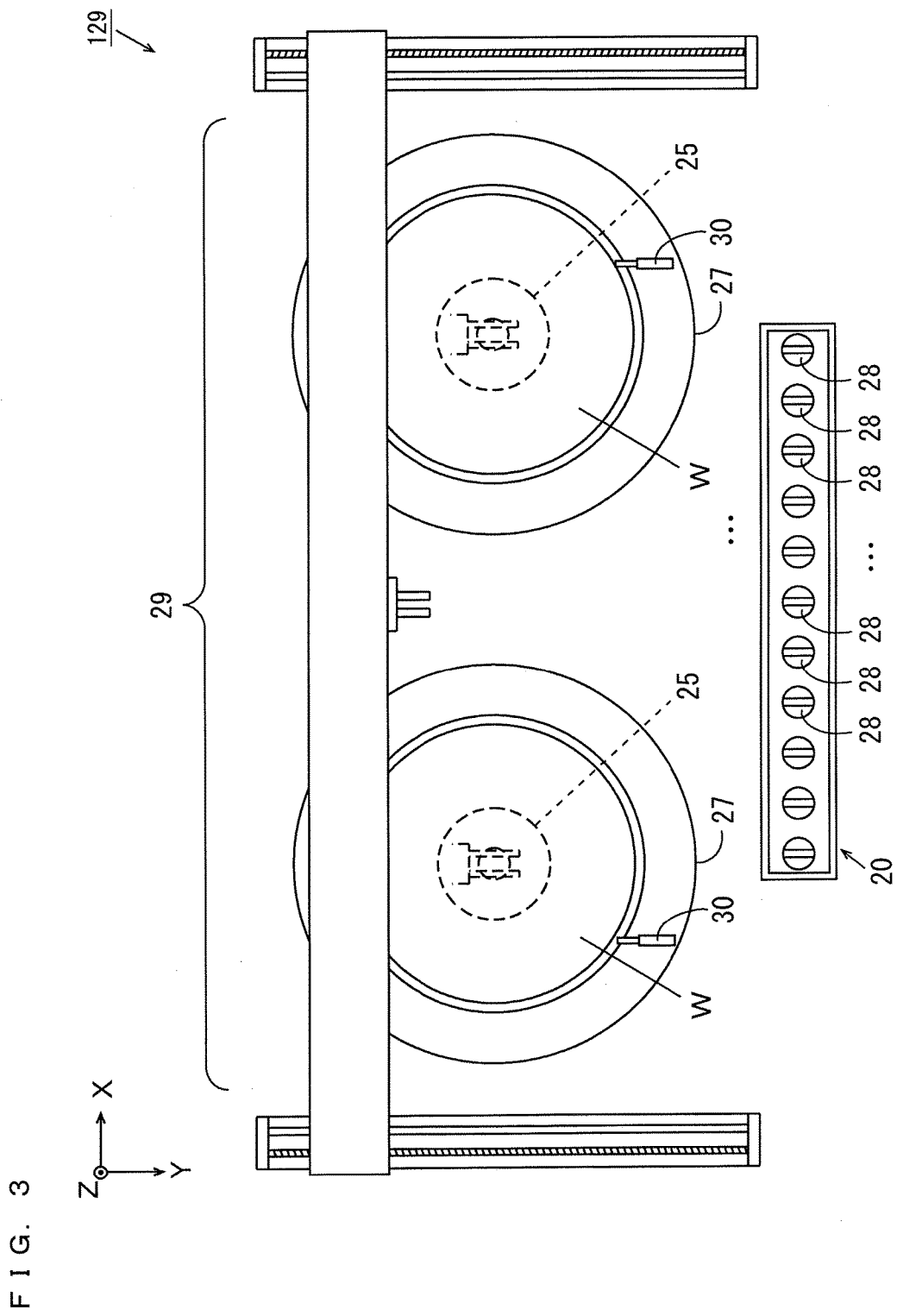
FIG. 3 is a plan view showing the configuration of a coating processing unit.

FIG. 3 is a plan view showing the configuration of the coating processing unit 129. As shown in FIGS. 2 and 3, each coating processing unit 129 includes a waiting section (a waiting space) 20, a plurality of spin chucks 25, a plurality of cups 27, a plurality of processing liquid nozzles 28, a nozzle transport mechanism (a nozzle transport robot) 29, and a plurality of edge rinse nozzles 30. In the present embodiment, two spin chucks 25, two cups 27, two edge rinse nozzles 30 are provided in each coating processing unit 129.

Each spin chuck 25 is driven to be rotated by a driving device (not shown) (an electrical motor, for example) while holding the substrate W. In the driving device, an encoder (not shown) is provided. A local controller LC1 of FIG. 7, described below, detects a rotation angle of the spin chuck 25 at all times based on an output signal of the encoder. Each cup 27 is provided to surround the spin chuck 25.

Various types of processing liquids, described below, are supplied to each processing liquid nozzle 28 from a processing liquid storage (not shown) through a processing liquid pipe. During the wait during which the processing liquid is not supplied to the substrate W, each processing liquid nozzle 28 is inserted into the waiting section 20. During the supply of the processing liquid to the substrate W, any of the processing liquid nozzles 28 in the waiting section 20 is held by the nozzle transport mechanism 29 and transported to a position directly upward of the substrate W.

The processing liquid is applied to the rotating substrate W by the discharge of the processing liquid from the processing liquid nozzle 28 while the spin chuck 25 is rotated. Further, the edge rinse nozzle 30 is moved to a position in the vicinity of the peripheral portion of the substrate W from a predetermined waiting position. The peripheral portion of the substrate W refers to a region having a constant width extending along an outer periphery of the substrate W on the surface of the substrate W.

A rinse liquid is discharged from the edge rinse nozzle 30 to the peripheral portion of the rotating substrate W while the spin chuck 25 is rotated, whereby the peripheral portion of the processing liquid applied to the substrate W is dissolved. Thus, the processing liquid at the peripheral portion of the substrate W is removed. Details of the supply of the processing liquid and the rinse liquid to the substrate W (hereinafter referred to as coating processing) will be described below.

In the present embodiment, in the coating processing unit 129 in each of the coating processing chambers 22, 24 of FIG. 2, a processing liquid for an anti-reflection film (an anti-reflection liquid) is supplied from the processing liquid nozzle 28 to the substrate W. In the coating processing unit 129 in each of the coating processing chambers 21, 23, a processing liquid for a resist film (a resist liquid) is supplied from the processing liquid nozzle 28 to the substrate W.

As shown in FIG. 2, the development processing unit 139 includes a plurality of spin chucks 35 and a plurality of cups 37 similarly to the coating processing unit 129. Further, as shown in FIG. 1, the development processing unit 139 includes two slit nozzles 38 that discharge a development liquid and a moving mechanism (a moving robot) 39 that moves these slit nozzles 38 in the X direction.

In the development processing unit 139, each spin chuck 35 is rotated by a driving device (not shown). Thus, the substrate W is rotated. In the driving device of the spin chuck 35, an encoder (not shown) is provided. A local controller LC2 of FIG. 7, described below, detects a rotation angle of each spin chuck 35 at all times based on an output signal of the encoder. Each slit nozzle 38 supplies the development liquid to each rotating substrate W while moving. Thus, development processing for the substrate W is performed.

A plurality (four in the present example) of cleaning drying processing units SD1 are provided in the cleaning drying processing section 161. In each cleaning drying processing unit SD1, cleaning and drying processing for the substrate W before the exposure processing are performed.

(3) Coating Processing

Figure 4A:
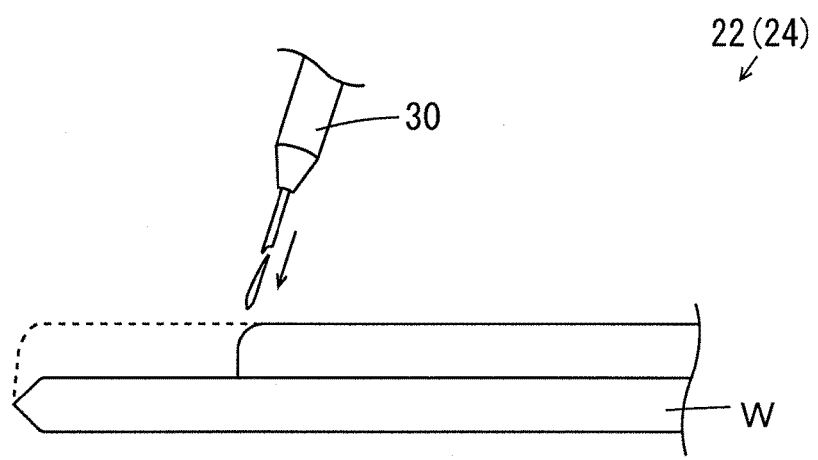
FIGS. 4A and 4B are diagrams showing formation steps of an anti-reflection film on a surface of the substrate and a removal range of the anti-reflection film.
Figure 4B:
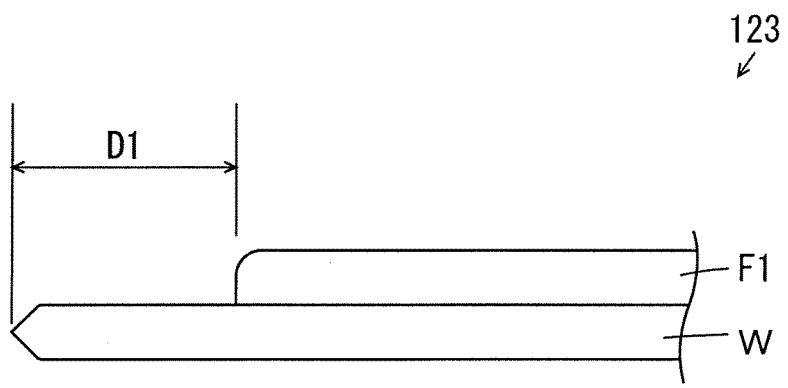
Figure 5A:
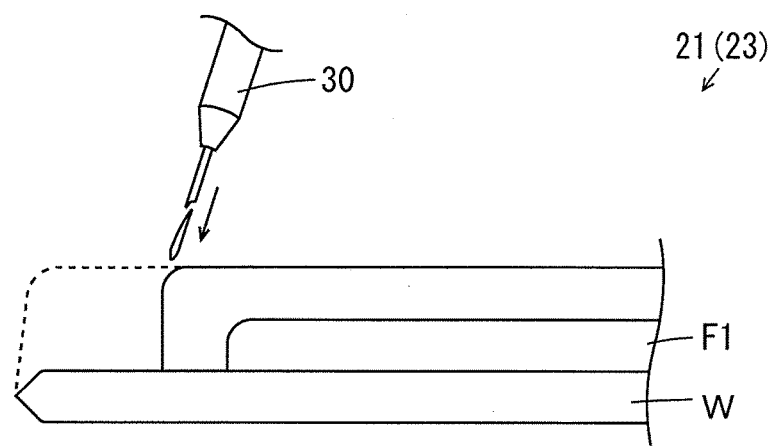
FIGS. 5A and 5B are diagrams showing formation steps of a resist film on the surface of the substrate and a removal range of the resist film.
Figure 5B:
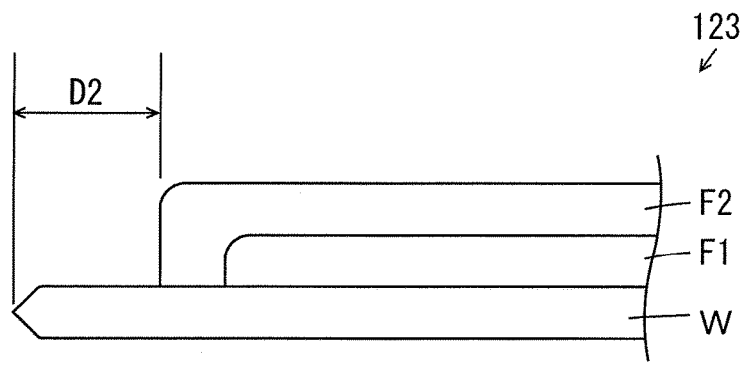

FIGS. 4A and 4B are diagrams showing formation steps of the anti-reflection film on the surface of the substrate W and a removal range of the anti-reflection film. FIGS. 5A and 5B are diagrams showing formation steps of the resist film on the surface of the substrate W and a removal range of the resist film.

First, in the coating processing unit 129 in the coating processing chamber 22 (or the coating processing chamber 24) of FIG. 2, the anti-reflection liquid is applied to the surface of the substrate W from the processing liquid nozzle 28 (FIG. 3) while the substrate W is rotated. Further, the rinse liquid is discharged from the edge rinse nozzle 30 to the peripheral portion of the substrate W. Thus, as shown in FIG. 4A, the anti-reflection liquid adhering to the peripheral portion of the substrate W is dissolved. In this manner, the anti-reflection liquid in an annular region at the peripheral portion of the substrate W is removed.

Thereafter, predetermined thermal processing is performed on the substrate W by the thermal processing section 123, so that an anti-reflection film F1 is formed on the surface of the substrate W except for the peripheral portion as shown in FIG. 4B. The width between the outer edge of the substrate W and the outer edge of the anti-reflection film F1 is referred to as an edge cut width D1.

Next, in the coating processing unit 129 in the coating processing chamber 21 (or the coating processing chamber 23) of FIG. 2, the resist liquid is applied to the surface of the substrate W from the processing liquid nozzle 28 while the substrate W is rotated. Further, the rinse liquid is discharged from the edge rinse nozzle 30 to the peripheral portion of the substrate W. Thus, as shown in FIG. 5A, the resist liquid adhering to the peripheral portion of the substrate W is dissolved. In this manner, the resist liquid in an annular region at the peripheral portion of the substrate W is removed.

Thereafter, predetermined thermal processing is performed on the substrate W by the thermal processing section 123, so that a resist film F2 is formed to cover the anti-reflection film F1 on the substrate W except for the peripheral portion as shown in FIG. 5B. The width between the outer edge of the substrate W and the outer edge of the resist film F2 is referred to as an edge cut width D2.

Figure 6A:
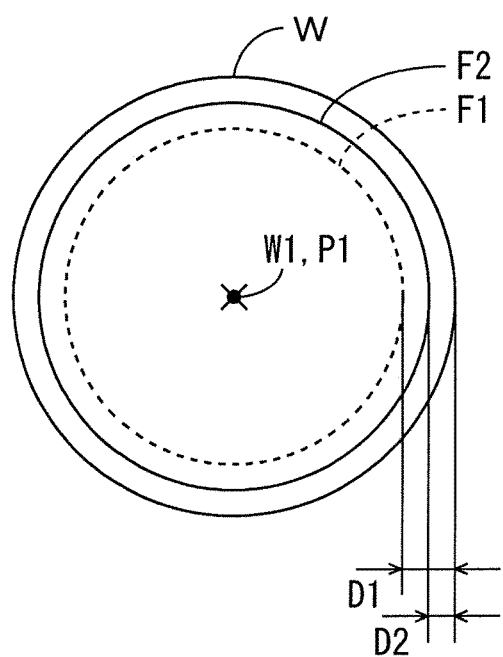
FIGS. 6A and 6B are plan views of the substrate on which the anti-reflection film and the resist film are formed.
Figure 6B:
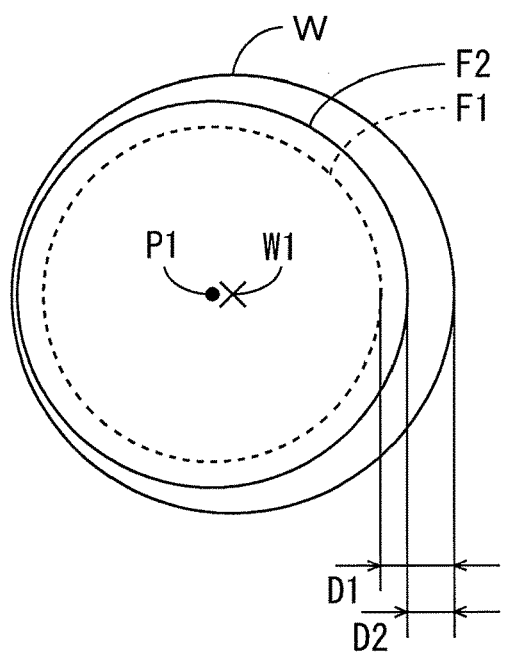

Each of FIGS. 6A and 6B is a plan view of the substrate W on which the anti-reflection film F1 and the resist film F2 are formed. In the example of FIG. 6A, in the coating processing unit 129 (FIG. 3), the substrate W is placed on the spin chuck 25 such that a geometric center W1 of the substrate W (hereinafter referred to as a center of the substrate W) coincides with an axial center P1 of the spin chuck 25 (FIG. 3). The axial center P1 of the spin chuck 25 is equivalent to a rotation center of the substrate W. In the case where the coating processing is performed in this state, the anti-reflection film F1 and the resist film F2 are formed such that setting values of the edge cut widths D1, D2 are uniform over the entire peripheral portion of the substrate W.

On the one hand, in the example of FIG. 6B, in the coating processing unit 129, the substrate W is placed on the spin chuck 25 such that the center W1 of the substrate W deviates from the axial center P1 of the spin chuck 25. In the case where the coating processing is performed in this state, the anti-reflection film F1 and the resist film F2 are formed on the substrate W such that the edge cut widths D1, D2 are non-uniform.

Therefore, a deviation amount of the substrate W in the coating processing unit 129 can be calculated by detection of the edge cut widths D1, D2 of the substrate W. The deviation amount of the substrate W refers to an amount of position deviation of the center W1 of the substrate W from the axial center P1 of the spin chuck 25.

(4) Thermal Processing Sections

Figure 7:
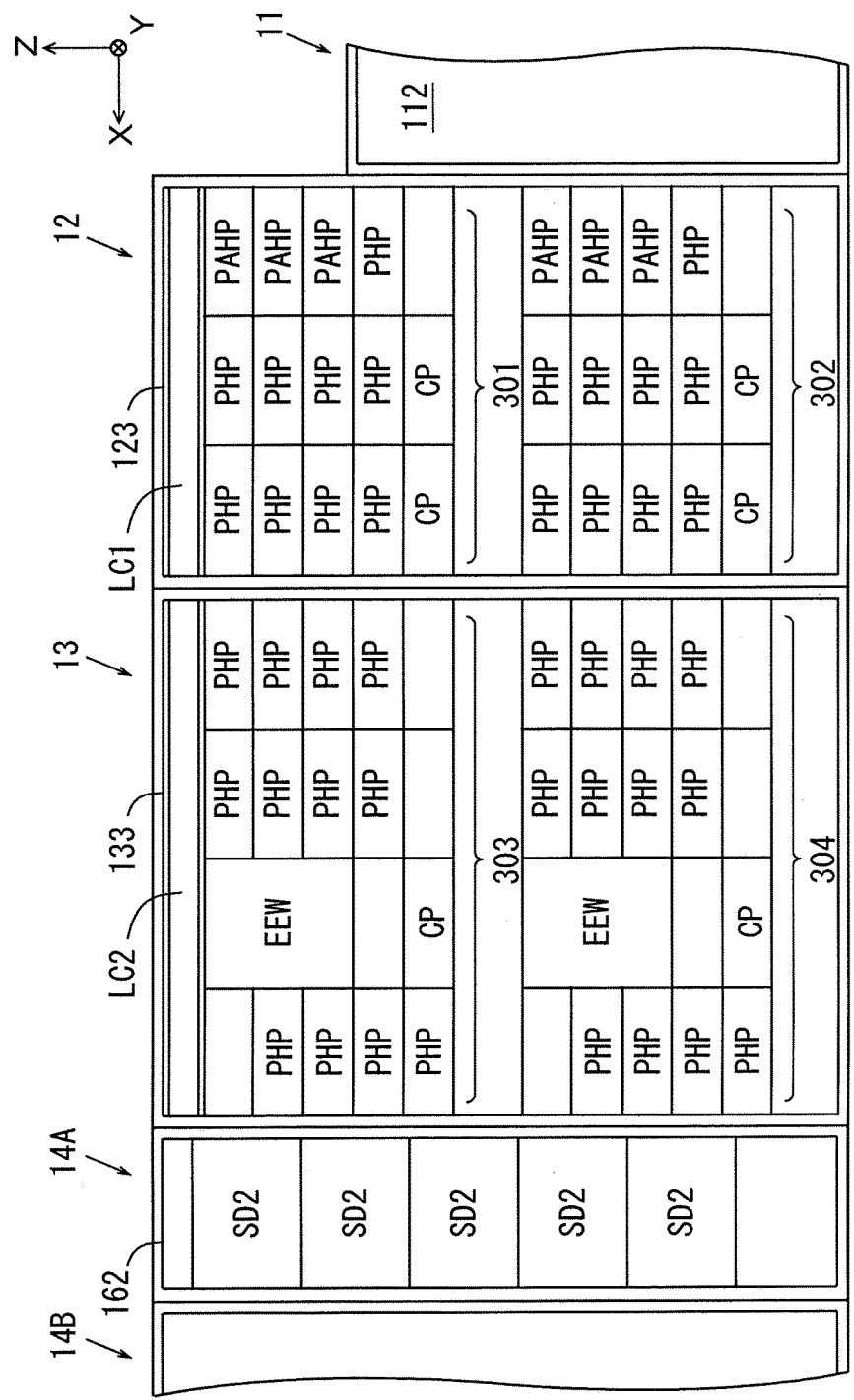
FIG. 7 is a schematic side view showing the inner configuration of each of a thermal processing section and the cleaning drying processing section of FIG. 1.

FIG. 7 is a schematic side view showing the inner configuration of the thermal processing sections 123, 133 and the cleaning drying processing section 162 of FIG. 1. As shown in FIG. 7, the thermal processing section 123 has an upper thermal processing section (an upper thermal processing space) 301 provided above and a lower thermal processing section (a lower thermal processing space) 302 provided below. In the upper thermal processing section 301 and the lower thermal processing section 302, a plurality of thermal processing units (thermal processors) PHP, a plurality of adhesion reinforcement processing units (adhesion reinforcement processors) PAHP and a plurality of cooling units (coolers) CP are provided.

The local controller LC1 is provided at the top of the thermal processing section 123. The local controller LC1 controls the operation of each of the coating processing section 121, the transport section 122 and the thermal processing section 123 based on the instruction from a main controller 400 of FIG. 1.

In each thermal processing unit PHP, heating processing and cooling processing for the substrate W are performed. In each adhesion reinforcement processing unit PAHP, the adhesion reinforcement processing for improving the adhesion between the substrate W and the anti-reflection film is performed. Specifically, in the adhesion reinforcement processing unit PAHP, an adhesion reinforcement agent such as HMDS (hexamethyldisilazane) is applied to the substrate W, and the heating processing is performed on the substrate W. In the cooling unit CP, the cooling processing for the substrate W is performed.

The thermal processing section 133 has an upper thermal processing section (an upper thermal processing space) 303 provided above and a lower thermal processing section (a lower thermal processing space) 304 provided below. A cooling unit CP, a plurality of thermal processing units PHP, and an edge exposure unit EEW are provided in each of the upper thermal processing section 303 and the lower thermal processing section 304. The thermal processing units PHP in each of the upper thermal processing section 303 and the lower thermal processing section 304 are configured to be capable of carrying in the substrates W from the cleaning drying processing block 14A.

The local controller LC2 is provided at the top of the thermal processing section 133. The local controller LC2 controls the operation of each of the development processing section 131, the transport section 132 and the thermal processing section 133 based on the instruction from the main controller 400 of FIG. 1.

In the edge exposure unit EEW, state detection processing for the peripheral portion of the substrate W is performed as described below. Based on the result of detection, it is determined whether the substrate W is placed on the spin chuck 25 such that the center of the substrate W coincides with the axial center of the spin chuck 25 in the coating processing unit 129 (FIG. 2).

Thereafter, in the edge exposure unit EEW, exposure processing for the peripheral portion of the substrate W (edge exposure processing) is performed. The edge exposure processing is performed on the substrate W, so that the resist film on the peripheral portion of the substrate W is removed during the subsequent development processing. Thus, in the case where the peripheral portion of the substrate W comes into contact with another member after the development processing, generation of particles caused by stripping of the resist film on the peripheral portion of the substrate W is prevented.

In this manner, in the edge exposure unit EEW, the state detection processing and the edge exposure processing can be performed. Therefore, an increase in size of the substrate processing apparatus 100 and an increase in footprint can be prevented.

A plurality (five in this example) of cleaning drying processing units (cleaning drying processors) SD2 are provided in the cleaning drying processing section 162. In each cleaning drying processing unit SD2, the cleaning and drying processing for the substrate W after the exposure processing are performed.

(5) Edge Exposure Units

Figure 10:
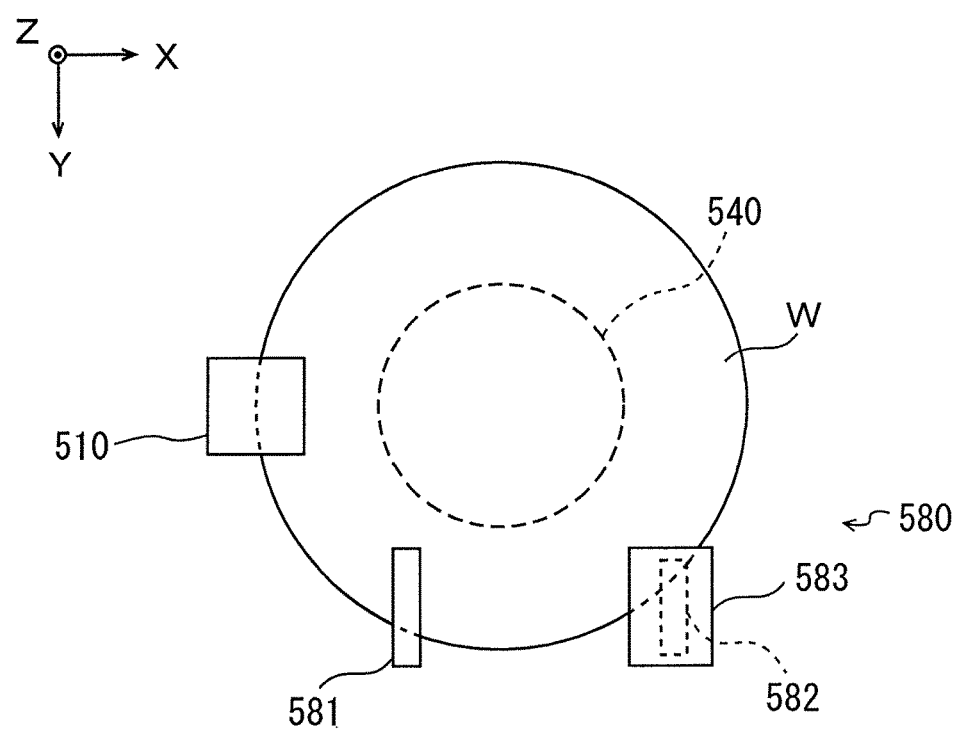
FIG. 10 is a schematic plan view of the edge exposure unit.

FIG. 8 is a diagram schematically showing one side surface of the edge exposure unit EEW. FIG. 9 is a diagram schematically showing another side surface of the edge exposure unit EEW. Further, FIG. 10 is a schematic plan view of the edge exposure unit EEW. As shown in FIGS. 8 and 9, the edge exposure unit EEW includes a light emitter 510, a light emitter holding unit (a light emitter holder) 520, a substrate rotation unit (a substrate rotator) 540 and a state detection processing unit (a state detector) 580.

The light emitter 510 is connected to a light source for exposure (not shown), described below, via a light guide made of an optical fiber cable or the like. Thus, the peripheral portion of the substrate W is irradiated by the light emitter 510 with the light sent from the light source for exposure via the light guide. Hereinafter, the light with which the substrate W is irradiated by the light emitter 510 in order to expose the resist film on the substrate W is referred to as exposure light. The light emitter holding unit 520 holds the light emitter 510 to be movable in the X direction and the Y direction. The substrate rotation unit 540 holds the substrate W by suction and rotates the substrate W.

As shown in FIG. 10, the state detection processing unit 580 includes an illuminator 581, a reflection mirror 582, and a CCD (Charge-Coupled Device) line sensor 583. The illuminator 581 is arranged directly upward of the peripheral portion of the substrate W in the Y direction. The reflection mirror 582 is arranged above the substrate W to be opposite to the illuminator 581. The CCD line sensor 583 is arranged directly upward of the reflection mirror 582. The CCD line sensor 583 is arranged such that an arrangement direction of pixels is the Y direction.

Strip-shape light for detecting the state of the peripheral portion of the substrate W (hereinafter referred to as illumination light) is generated from the illuminator 581. The peripheral portion of the substrate W is irradiated with the illumination light. The emitted illumination light is reflected on the substrate W, and is further reflected on the reflection mirror 582, and is projected on the CCD line sensor 583. The distribution of the light reception amount of the CCD line sensor 583 corresponds to the distribution of brightness of the reflected light at the peripheral portion of the substrate W.

The distribution of brightness of the reflected light at the surface of the substrate W differs depending on the state of the peripheral portion of the substrate W. Specifically, in the case where the anti-reflection film F1 and the resist film F2 are formed on the substrate W, the distribution of brightness of the reflected light at the surface of the substrate W differs depending on the formation region of each of the anti-reflection film F1 and the resist film F2. In the present embodiment, based on the distribution of the light reception amount of the CCD line sensor 583, the state detection processing for the peripheral portion of the substrate W, described below, is performed.

(6) Transport Section

Figure 11:
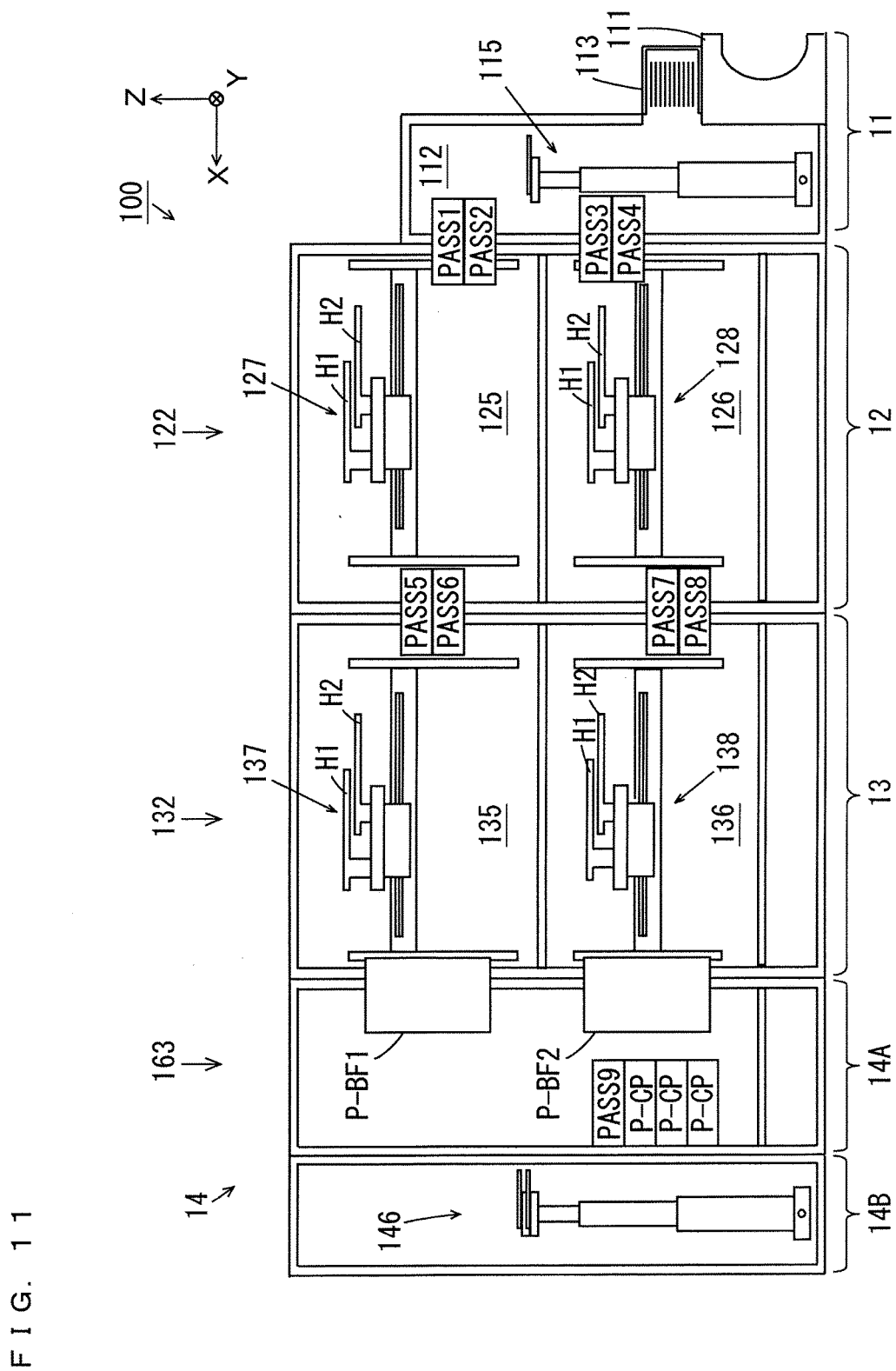
FIG. 11 is a schematic side view showing the inner configuration of a transport section.

FIG. 11 is a schematic side view showing the inner configuration of each of the transport sections 122, 132, 163. As shown in FIG. 11, the transport section 122 has an upper transport chamber 125 and a lower transport chamber 126. The transport section 132 has an upper transport chamber 135 and a lower transport chamber 136. The upper transport chamber 125 is provided with the transport mechanism 127, and the lower transport chamber 126 is provided with the transport mechanism 128. Further, the upper transport chamber 135 is provided with the transport mechanism 137, and the lower transport chamber 136 is provided with the transport mechanism 138.

The upper thermal processing section 301 (FIG. 7) is opposite to the coating processing chambers 21, 22 (FIG. 2) with the upper transport chamber 125 sandwiched therebetween. The lower thermal processing section 302 (FIG. 7) is opposite to the coating processing chambers 23, 24 (FIG. 2) with the lower transport chamber 126 sandwiched therebetween. The upper thermal processing section 303 (FIG. 7) is opposite to the development processing chambers 31, 32 (FIG. 2) with the upper transport chamber 135 sandwiched therebetween. The lower thermal processing section 304 (FIG. 7) is opposite to the development processing chambers 33, 34 (FIG. 2) with the lower transport chamber 136 sandwiched therebetween.

The substrate platforms PASS1, PASS2 are provided between the transport section 112 and the upper transport chamber 125, and the substrate platforms PASS3, PASS4 are provided between the transport section 112 and the lower transport chamber 126. The substrate platforms PASS5, PASS6 are provided between the upper transport chamber 125 and the upper transport chamber 135, and the substrate platforms PASS7, PASS8 are provided between the lower transport chamber 126 and the lower transport chamber 136.

The placement buffer unit P-BF1 is provided between the upper transport chamber 135 and the transport section 163, and the placement buffer unit P-BF2 is provided between the lower transport chamber 136 and the transport section 163. The substrate platform PASS9 and the plurality of placement cooling units P-CP are provided in the transport section 163 to be adjacent to the carry-in carry-out block 14B.

The placement buffer unit P-BF1 is configured to be capable of carrying in and carrying out the substrate W by the transport mechanism 137 and the transport mechanisms 141, 142 (FIG. 1). The placement buffer unit P-BF2 is configured to be capable of carrying in and carrying out the substrate W by the transport mechanism 138 and the transport mechanisms 141, 142 (FIG. 1). Further, the substrate platform PASS9 and the placement cooling units P-CP are configured to be capable of carrying in and carrying out the substrates W by the transport mechanisms 141, 142 (FIG. 1) and the transport mechanism 146.

The substrates W transported from the indexer block 11 to the coating block 12 are placed on the substrate platform PASS1 and the substrate platform PASS3. The substrates W transported from the coating block 12 to the indexer block 11 are placed on the substrate platform PASS2 and the substrate platform PASS4.

The substrates W transported from the coating block 12 to the development block 13 are placed on the substrate platform PASS5 and the substrate platforms PASS7. The substrates W transported from the development block 13 to the coating block 12 are placed on the substrate platform PASS6 and the substrate platform PASS8.

The substrates W transported from the development block 13 to the cleaning drying processing block 14A are placed on the placement buffer units P-BF1, P-BF2. The substrates W transported from the cleaning drying processing block 14A to the carry-in carry-out block 14B are placed on the placement cooling units P-CP. The substrates W transported from the carry-in carry-out block 14B to the cleaning drying processing block 14A are placed on the substrate platform PASS9.

(7) Transport Mechanism

Each transport mechanism 127, 128, 137, 138 has two hands H1, H2. The transport mechanism 127 receives the substrates W from and transfers the substrates W to each of the coating processing chambers 21, 22 (FIG. 2), the substrate platforms PASS1, PASS2, PASS5, PASS6 (FIG. 11) and the upper thermal processing section 301 (FIG. 7) using the hands H1, H2. The transport mechanism 128 receives the substrates W from and transfers the substrates W to each of the coating processing chambers 23, 24 (FIG. 2), the substrate platform PASS3, PASS4, PASS7, PASS8 (FIG. 11), and the lower thermal processing section 302 (FIG. 7) using the hands H1, H2.

The transport mechanism 137 receives the substrates W from and transfers the substrates W to each of the development processing chambers 31, 32 (FIG. 2), the substrate platforms PASS5, PASS6 (FIG. 11), the placement buffer units P-BF1 (FIG. 11) and the upper thermal processing section 303 (FIG. 7) using the hands H1, H2. The transport mechanism 138 receives the substrates W from and transfers the substrates W to each of the development processing chambers 33, 34 (FIG. 2), the substrate platforms PASS7, PASS8 (FIG. 11), the placement buffer unit P-BF2 (FIG. 11) and the lower thermal processing section 304 (FIG. 7) using the hands H1, H2.

Figure 12A:
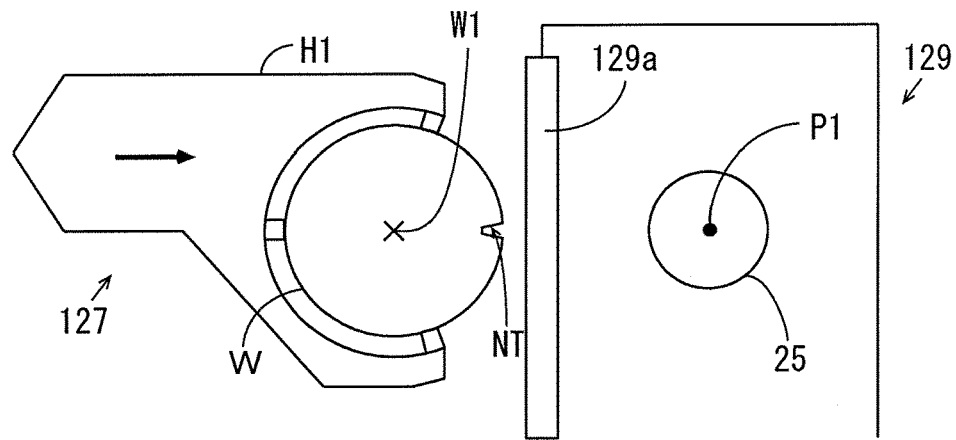
FIGS. 12A to 12C are diagrams for explaining an operation of a hand of a transport mechanism at the time of carrying of the substrate into the coating processing unit of FIG. 2.
Figure 12B:
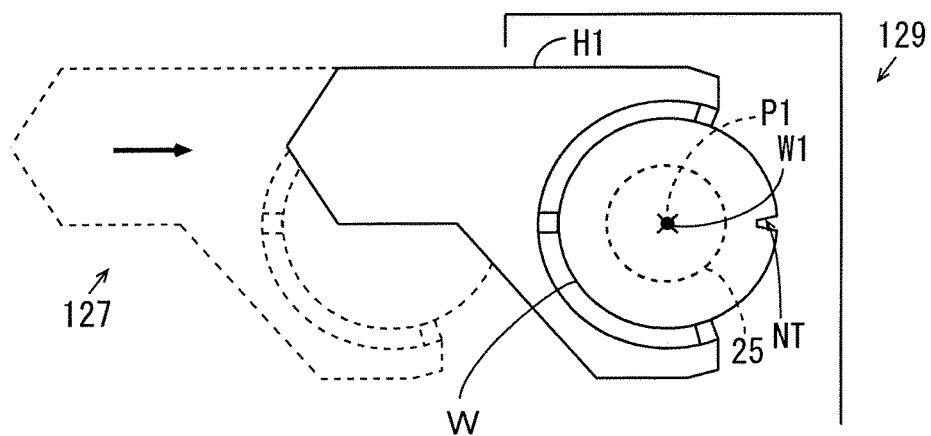
Figure 12C:
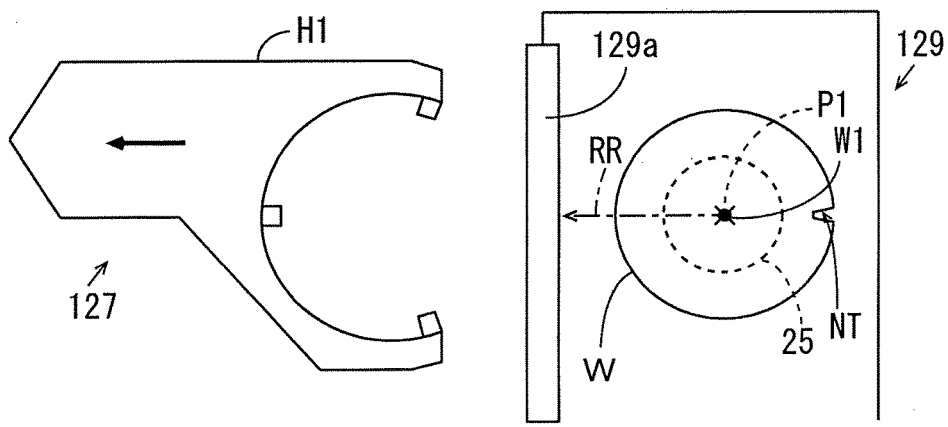
Figure 14A:
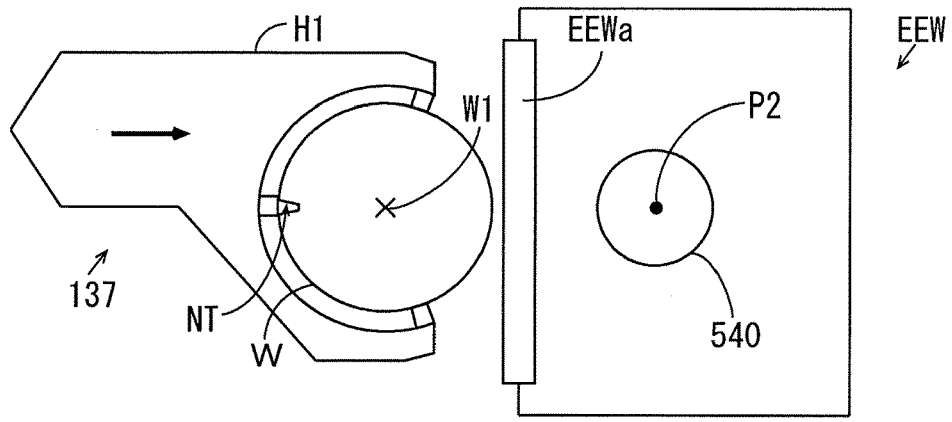
FIGS. 14A to 14C are diagrams for explaining an operation of a hand of the transport mechanism at the time of carrying of the substrate into the edge exposure unit of FIG. 9.
Figure 14B:
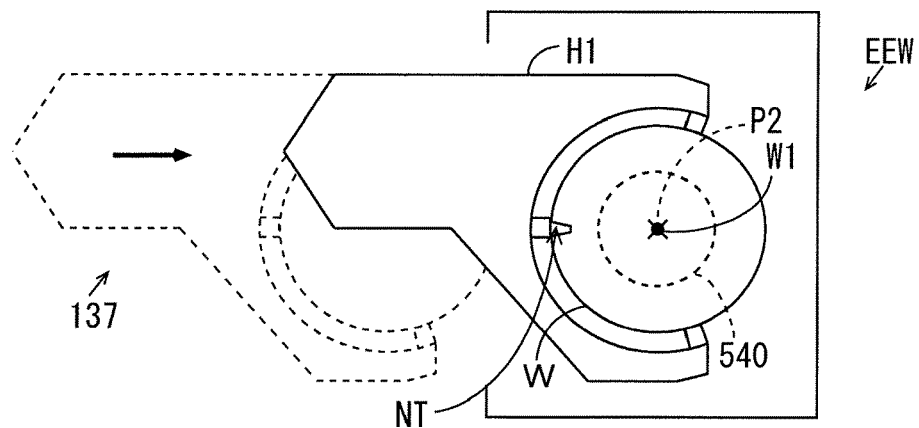
Figure 14C:
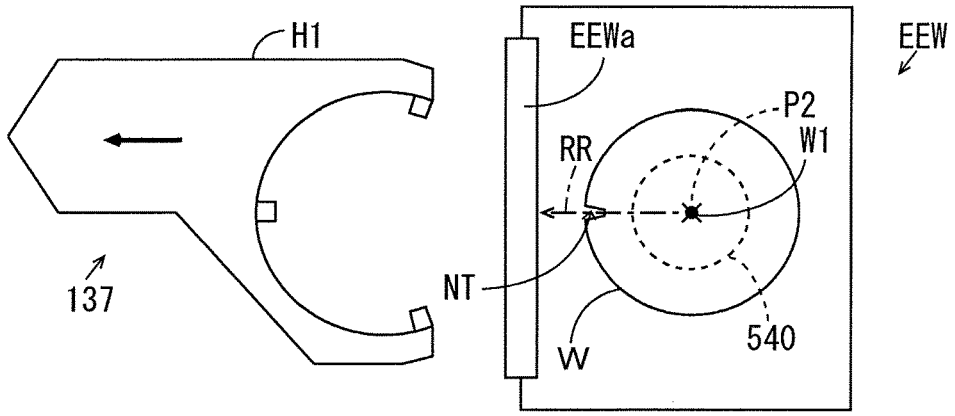

FIGS. 12A to 12C are diagrams for explaining the operation of the hand H1 of the transport mechanism 127 at the time of carrying of the substrate W into the coating processing unit 129 of FIG. 2. FIGS. 13A to 13C are diagrams for explaining receiving and transferring of the substrates W between the transport mechanisms 127, 137. FIGS. 14A to 14C are diagrams for explaining the operation of the hand H1 of the transport mechanism 137 at the time of carrying of the substrate W into the edge exposure unit EEW of FIG. 9.

In FIGS. 12A to 14C, part of the configuration of each of the transport mechanisms 127, 137, the coating processing unit 129, the substrate platform PASS5 and the edge exposure unit EEW is shown in top views. Further, the operation of the hand H2 of each of the transport mechanisms 127, 137 is similar to the operation of the hand H1. Further, the operation of each of the hands H1, H2 of the transport mechanisms 128, 138 of FIG. 11 is similar to the operation of each of the hands H1, H2 of the transport mechanisms 127, 137.

In FIG. 12A, as indicated by an arrow, the substrate W held by the hand H1 of the transport mechanism 127 is carried into the coating processing unit 129 from a substrate inlet port 129a of the coating processing unit 129. The positional relationship between the hand H1 and the spin chuck 25 is set in advance.

Next, as shown in FIG. 12B, the substrate W carried into the coating processing unit 129 is placed on the spin chuck 25 such that the center W1 of the substrate W coincides with the axial center P1 of the spin chuck 25. Thereafter, as shown in FIG. 12C, the hand H1 exits from the substrate outlet port 129a of the coating processing unit 129. In the coating processing unit 129, the coating processing is performed on the substrate W.

In the present embodiment, the spin chuck 25 is controlled by the local controller LC1 (FIG. 7) such that the substrate W is rotated N times (N is a natural number) during the coating processing. Therefore, an orientation of the substrate W being carried out from the coating processing unit 129 after the coating processing is equal to an orientation of the substrate W being carried into the coating processing unit 129. In the present embodiment, the orientation of the substrate W refers to an angle formed by a straight line connecting the center W1 to a notch NT of the substrate W with a preset reference direction RR.

The reference direction RR is set specifically for every spin chuck 25, 35 (FIG. 2) or substrate rotation unit 540 (FIG. 8). In the present example, in the spin chuck 25, a direction extending from the axial center P1 of the spin chuck 25 towards the substrate inlet port 129a of the coating processing unit 129 in the shortest distance is referred to as the reference direction RR. In the substrate rotation unit 540 of FIGS. 14A to 14C, described below, a direction extending from an axial center P2 of the substrate rotation unit 540 towards a substrate inlet port EEWa of the edge exposure unit EEW in the shortest distance is referred to as the reference direction RR.

The substrate W on which the anti-reflection film F1 and the resist film F2 of FIG. 5B are formed is carried into the substrate platform PASS5 by the transport mechanism 127 as shown in FIG. 13A, and placed on the substrate platform PASS5 as shown in FIG. 13B. Thereafter, the substrate W placed on the substrate platform PASS5 is carried out by the transport mechanism 137 as shown in FIG. 13C.

In FIG. 14A, as indicated by an arrow, the substrate W held by the hand H1 of the transport mechanism 137 is carried into the edge exposure unit EEW from the substrate inlet port EEWa of the edge exposure unit EEW. The positional relationship between the hand H1 and the substrate rotation unit 540 is set in advance.

Next, as shown in FIG. 14B, the substrate W carried into the edge exposure unit EEW is placed on the substrate rotation unit 540 such that the center W1 of the substrate W coincides with the axial center P2 of the substrate rotation unit 540. Thereafter, as shown in FIG. 14C, the hand H1 exits from the substrate inlet port EEWa of the edge exposure unit EEW. In the edge exposure unit EEW, the state detection processing and the edge exposure processing are performed on the substrate W.

(8) Detection of Edge Cut Widths

In the state detection processing, the entire peripheral portion of the substrate W is irradiated with the illumination light while the substrate W makes a full revolution (by 360 degrees). In the present example, the position of the notch NT of the substrate W is detected by the CCD line sensor 583, whereby the substrate rotation unit 540 is controlled such that the substrate W makes a full revolution. Therefore, in the present example, it is not necessary to provide an encoder in the substrate rotation unit 540 of the edge exposure unit EEW. Thus, an increase in cost of the substrate processing apparatus 100 can be inhibited.

In a period during which the substrate W makes a full revolution, the distribution of the light reception amount of the CCD line sensor 583 is successively supplied to the main controller 400 via the local controller LC2. Based on the distribution of the light reception amount of the CCD line sensor 583, the pieces of peripheral portion image data indicating the distribution of brightness of the reflected light over the entire peripheral portion of the substrate W are produced by the main controller 400.

FIGS. 15A to 15F are diagrams for explaining a method of producing the pieces of peripheral portion image data. In FIGS. 15A to 15C, the irradiation states on the surface of the substrate W with the illumination light are shown in order. In FIGS. 15D to 15F, the pieces of peripheral portion image data produced in the states of FIGS. 15A, 15B and 15C are respectively shown. In each of FIGS. 15A to 15C, hatching is applied to each region on the substrate W irradiated with the illumination light. Further, in FIGS. 15D to 15F, the pieces of peripheral portion image data are displayed in the forms of the images displayed based on the pieces of peripheral portion image data in order to facilitate understanding.

As shown in each of FIGS. 15A to 15C, the substrate W is rotated while the peripheral portion on the substrate W is successively irradiated with the illumination light. Thus, the illumination light is successively emitted in a circumferential direction of the substrate W. When the substrate W makes a full revolution, the entire peripheral portion of the substrate W is irradiated with the illumination light. Based on the distribution of the light reception amount of the CCD line sensor 583 that is successively acquired in the period during which the substrate W makes a full revolution, a piece of rectangular peripheral portion image data d1 is produced as shown in each of FIGS. 15D to 15F.

A position in a longitudinal direction of the piece of peripheral portion image data d1 corresponds to a position of each pixel of the CCD line sensor 583 (a position in a radial direction of the substrate W), and a position in a lateral direction of the piece of peripheral portion image data d1 corresponds to the rotation angle of the substrate W. In this case, the change in the longitudinal direction of the piece of peripheral portion image data d1 indicates the distribution of brightness of the reflected light in the radial direction of the substrate W in a region T1 at the peripheral portion of the substrate W. The change in the lateral direction of the piece of peripheral portion image data d1 indicates the distribution of brightness in the region T1 at the peripheral portion of the substrate W in the circumferential direction of the substrate W.

At the time point at which the substrate W makes a full revolution, the distribution of brightness of the reflected light in the entire peripheral portion of the substrate W is acquired as one piece of rectangular peripheral portion image data d1. The image of the peripheral portion of the substrate W (hereinafter referred to as a peripheral portion image) is displayed based on the piece of peripheral portion image data d1. The edge cut widths D1, D2 are detected based on the distance from a position of an outer edge EDG of the substrate W in the piece of peripheral portion image data d1.

Figure 16A:
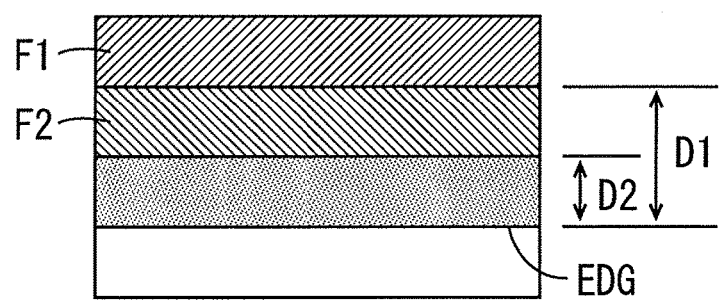
FIGS. 16A and 16B are diagrams showing distribution of brightness of a peripheral portion image displayed based on the pieces of peripheral portion image data.
Figure 16B:
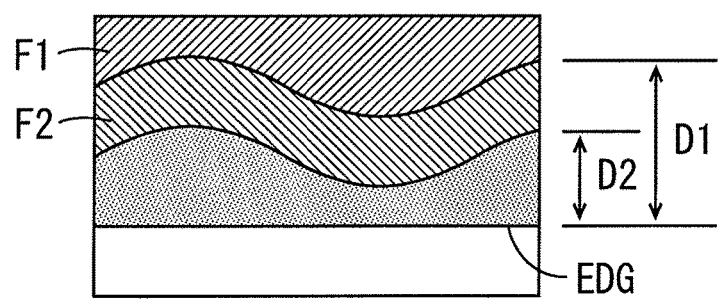

Each of FIGS. 16A and 16B is a diagram showing the distribution of brightness of the peripheral portion image displayed based on the piece of peripheral portion image data d1. In the case where the deviation amount of the substrate W on the spin chuck 25 is an allowable upper limit value or less, the edge cut widths D1, D2 are substantially constant over the entire peripheral portion of the substrate W as shown in FIG. 16A. On the one hand, in the case where the deviation amount of the substrate W on the spin chuck 25 exceeds the allowable upper limit value, the edge cut widths D1, D2 largely change as shown in FIG. 16B.

(9) Adjustment of Operation of Transport Mechanisms

As described above, in each edge exposure unit EEW, the deviation amount of the substrate W is calculated based on the change of the each of edge cut widths D1, D2. In the case where the deviation amount of the substrate W exceeds the allowable upper limit value, as for the substrate W carried into the spin chuck 25 afterwards, the operation of each of the transport mechanisms 127, 128 is adjusted such that the center W1 of the substrate W is placed at the axial center P1 of the spin chuck 25.

In the present embodiment, as shown in each of FIGS. 13A to 13C, the substrate W is transported from the transport mechanism 127 to the transport mechanism 137 with the substrate platform PASS5 sandwiched therebetween. The orientation of the notch NT of the substrate W for the transport mechanism 127 and the orientation of the notch NT of the substrate W for the transport mechanism 137 are different from each other by 180 degrees. Therefore, as shown in FIG. 12C and FIG. 14C, the orientation of the substrate W on the spin chuck 25 and the orientation of the substrate W on the substrate rotation unit 540 are different from each other by 180 degrees.

Figure 17A:
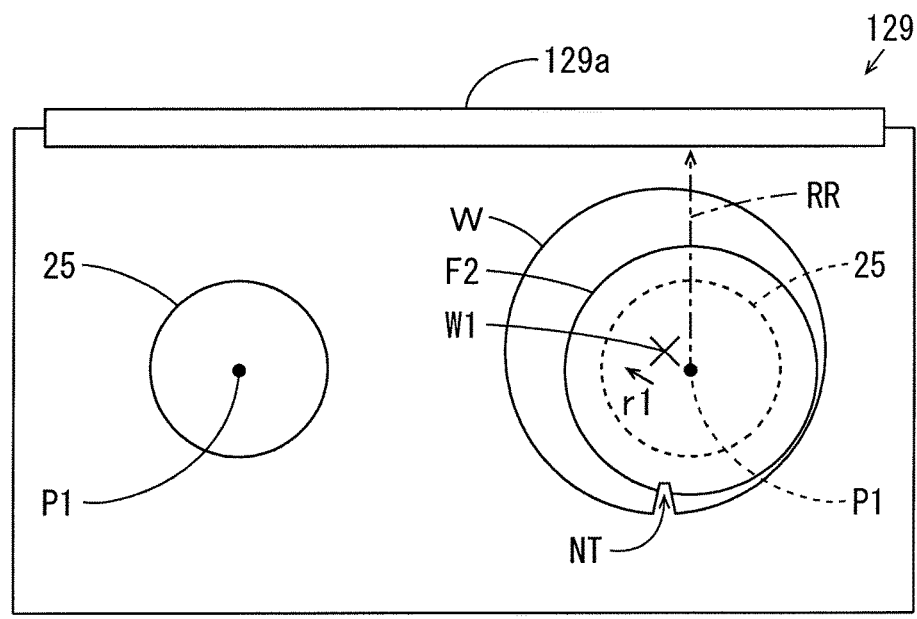
FIGS. 17A and 17B are diagrams showing a deviation of the substrate on each of a spin chuck and a substrate rotation unit.
Figure 17B:
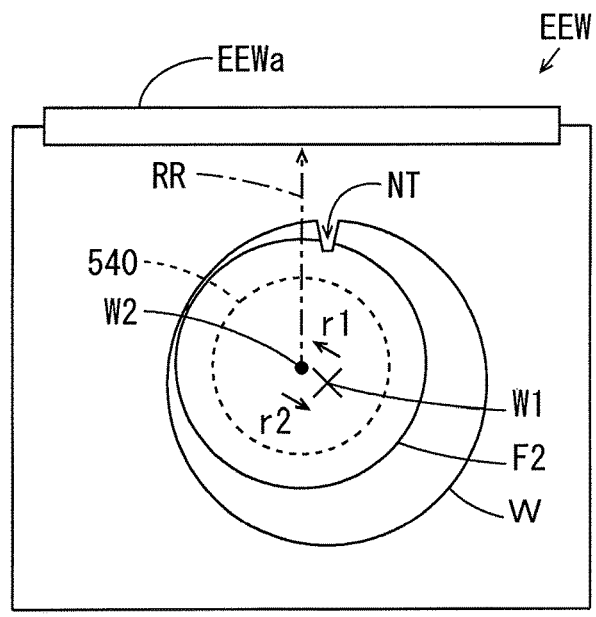

Each of FIGS. 17A and 17B is a diagram showing the deviation of the substrate W on each of the spin chuck 25 and the substrate rotation unit 540. In the example of FIG. 17A, the substrate W is placed with its center W1 deviating from the axial center P1 of the spin chuck 25 in a direction of an arrow r1. The direction of the arrow r1 is the direction of the straight line that forms a certain angle with the reference direction RR. In this case, the center W2 of the resist film F2 formed on the substrate W is formed at a position different from the center W1 of the substrate W.

Thereafter, the substrate W is transported to the edge exposure unit EEW. In the edge exposure unit EEW, a deviation amount of the center W1 from the center W2 corresponding to the axial center P1 of the spin chuck 25 is calculated as shown in FIG. 17B. Further, in the edge exposure unit EEW, the center W1 is located at a position deviating from the center W2 in a direction of an arrow r2. The direction of the arrow r2 is opposite to the direction of the arrow r1. Therefore, the position of the substrate W must be moved in the direction of the arrow r1 in order to place the center W1 of the substrate W at the center W2.

However, when the operation of each of the transport mechanisms 127, 128 is adjusted such that the substrate W is moved in the direction of the arrow r1 on the spin chuck 25, the center W1 is moved further away from the center W2 when the substrate W is placed on the spin chuck 25. In this manner, it is not possible to adjust the operation of each of the transport mechanisms 127, 128 only by the calculation of the deviation amount such that the center W1 of the substrate W is placed at the axial center P1 of the spin chuck 25.

Figure 18:
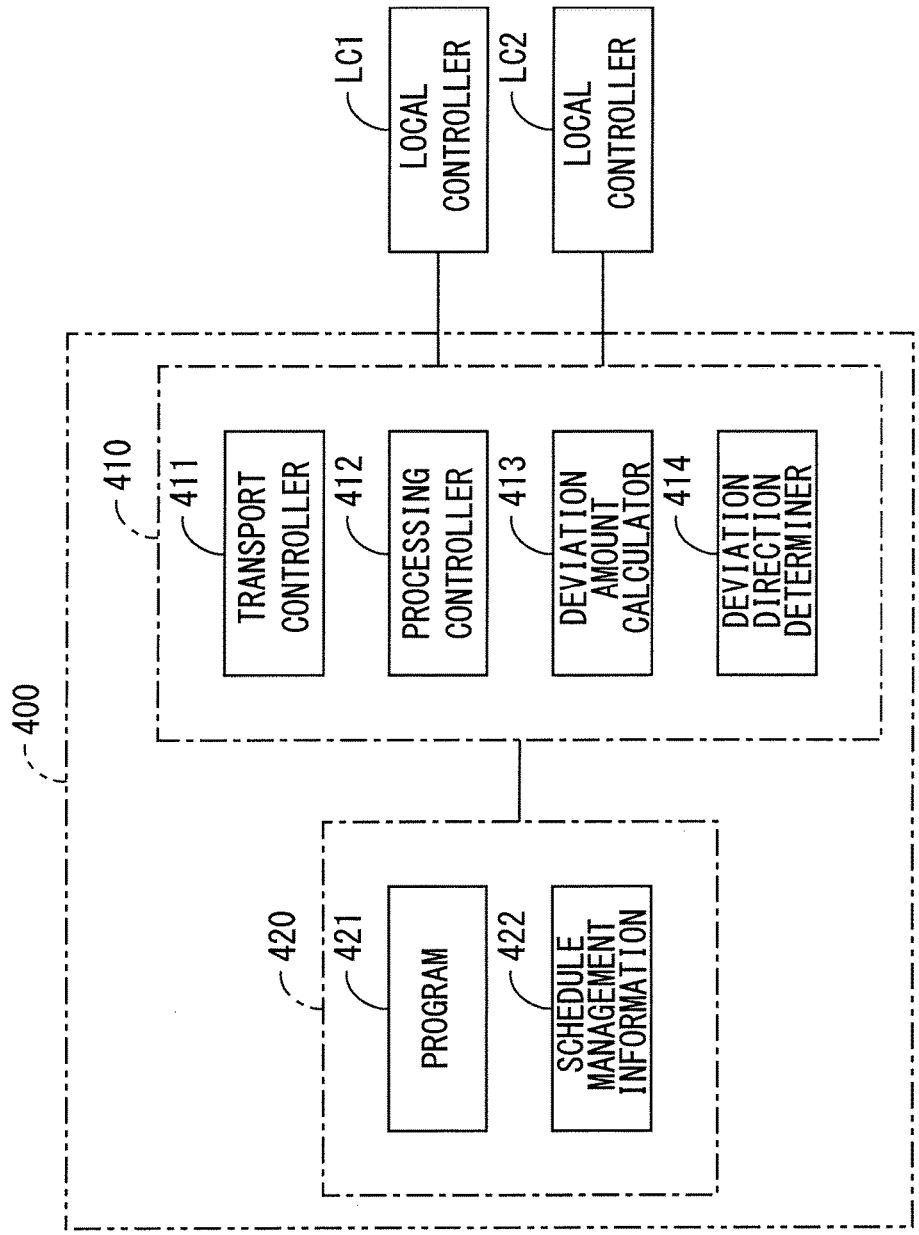
FIG. 18 is a block diagram showing the configuration of a control system of the substrate processing apparatus.

The main controller 400 has the below-mentioned configuration in order to adjust the operation of each of the transport mechanisms 127, 128 such that the center W1 of the substrate W is placed at the axial center P1 of the spin chuck 25. FIG. 18 is a block diagram showing the configuration of a control system of the substrate processing apparatus 100. As shown in FIG. 18, the main controller 400 includes a controller 410 and a storage 420.

A program 421 for performing the substrate processing is stored in the storage 420. Further, in the storage 420, pieces of schedule management information 422 including a transport path of the substrate W, the contents of processing and the like are stored as the conditions for the substrate processing.

The controller 410 includes a transport controller 411, a processing controller 412, a deviation amount calculator 413 and a deviation direction determiner 414. The function of each of the transport controller 411, the processing controller 412, the deviation amount calculator 413 and the deviation direction determiner 414 is realized by the execution of the program 421 stored in the storage 420 by the controller 410. The local controllers LC1, LC2 are connected to the controller 410.

The transport controller 411 controls the local controllers LC1, LC2 such that each of the transport mechanisms 115, 127, 128, 137, 138, 141, 142, 146 transports the substrate W along the transport path included in the pieces of schedule management information 422. Based on the contents of processing included in the pieces of schedule management information 422, the processing controller 412 controls the local controllers LC1, LC2 such that each of the coating block 12, the development block 13 and the interface block 14 performs the substrate processing.

The deviation amount calculator 413 acquires the distribution of the light reception amount of the CCD line sensor 583 of the edge exposure unit EEW of FIG. 9 via the local controller LC2. Further, the deviation amount calculator 413 calculates the deviation amount of the substrate W based on the received distribution of the light reception amount of the CCD line sensor 583.

The deviation direction determiner 414 acquires the pieces of information in regard to the transport path of the substrate W and the contents of processing from the pieces of schedule management information 422 stored in the storage 420. Further, based on the transport path of the substrate W from the spin chuck 25 to the substrate rotation unit 540 and the rotation angle of the substrate W by the spin chuck 25, the deviation direction determiner 414 specifies the relationship between the orientation of the substrate W on the spin chuck 25 and the orientation of the substrate W on the substrate rotation unit 540. Further, based on the specified relationship, the deviation direction determiner 414 determines the deviation direction of the center W1 of the substrate W held by the spin chuck 25 from the axial center P1 of the spin chuck 25.

Based on the deviation amount calculated by the deviation amount calculator 413 and the deviation direction determined by the deviation direction determiner 414, the transport controller 411 adjusts the carry-in operation of each of the transport mechanisms 127, 137 for the substrate W carried into the coating block 12 afterwards. Thus, the substrate W carried into the coating block 12 afterwards is carried into the coating processing unit 129 such that the center W1 coincides with the axial center P1 of the spin chuck 25.

(10) State Detection Processing

Figure 19:
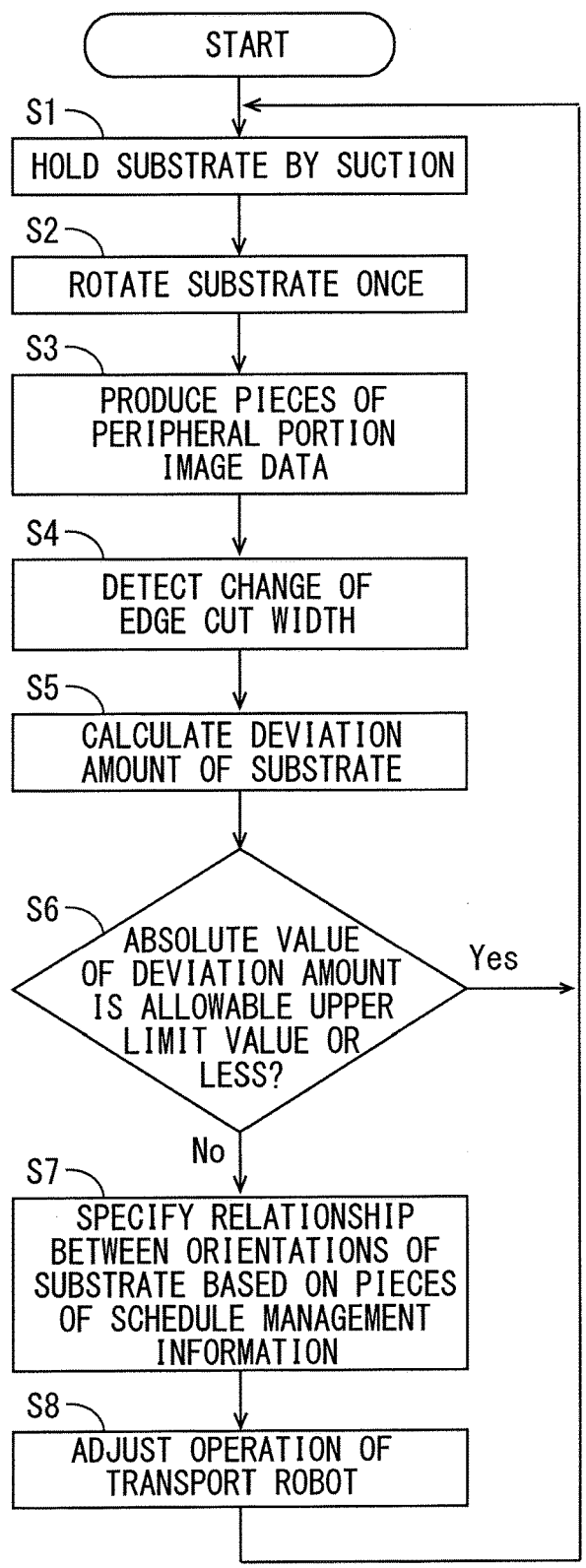
FIG. 19 is a flow chart showing an operation of a controller of a main controller of FIG. 18.

FIG. 19 is a flow chart showing the operation of the controller 410 of the main controller 400 of FIG. 18. While the state detection processing of the peripheral portion of the substrate W for the edge cut width D1 is explained in the following description, the state detection processing of the peripheral portion of the substrate W for the edge cut width D2 is similar to the state detection processing of the peripheral portion of the substrate W for the edge cut width D1.

First, the controller 410 places the substrate W on the substrate rotation unit 540 of the edge exposure unit EWW of FIG. 8 by controlling the transport mechanism 137 of FIG. 11 via the local controller LC2. Further, the controller 410 controls the substrate rotation unit 540 of FIG. 8 via the local controller LC2, so that the substrate W is held by suction on the substrate rotation unit 540 (step S1).

Next, the controller 410 rotates the substrate W held by the substrate rotation unit 540 by controlling the substrate rotation unit 540 via the local controller LC2 (step S2). In the period during which the substrate W makes a full revolution, the controller 410 produces a piece of peripheral portion image data d1 based on the distribution of the light reception amount of the CCD line sensor 583 of FIG. 8 (step S3).

Subsequently, based on the piece of produced peripheral portion image data d1, the controller 410 detects the change of the edge cut width D1 (step S4). Further, based on the detected change of the edge cut width D1, the controller 410 calculates the deviation amount of the substrate W (step S5).

Then, the controller 410 determines whether an absolute value of the deviation amount of the substrate W calculated in the step S5 is the preset allowable upper limit value or less (step S6). In the case where the absolute value of the deviation amount is the allowable upper limit value or less, the controller 410 returns to the processing of the step S1. Thus, the state detection processing is performed for the next substrate W.

On the one hand, in the case where the absolute value of the deviation amount exceeds the allowable upper limit value in the step S6, based on the pieces of schedule management information 422 stored in the storage 420, the controller 410 specifies the relationship between the orientation of the substrate W on the spin chuck 25 and the orientation of the substrate W on the substrate rotation unit 540 (step S7). Subsequently, the controller 410 adjusts the operation of the transport mechanism 127 based on the deviation amount of the substrate W calculated in the step S5 and the relationship between the orientations of the substrate W specified in the step S7 (step S8), and returns to the processing of the step 1. Thus, the state detection processing for the next substrate W is performed.

In the above-mentioned processing, even in the case where the position deviation of the center W1 of the substrate W from the axial center P1 of the spin chuck 25 has occurred in the middle of the substrate processing, the position deviation is detected in the edge exposure unit EEW. Further, as for each of subsequent substrates W, the operation of the transport mechanism 127 is adjusted such that the center W1 is placed on the axial center P1 of the spin shuck 25. Thus, regions of the substrate W that can be utilized for fabrication of a product can be increased.

(11) Substrate Processing

The substrate processing will be described with reference to FIGS. 1, 2, 7, and 11. Each carrier 113 in which unprocessed substrates W are stored is placed on each carrier platform 111 in the indexer block 11 (FIG. 1). The transport mechanism 115 transports the unprocessed substrate W from the carrier 113 to each of the substrate platforms PASS1, PASS3 (FIG. 11). Further, the transport mechanism 115 transports the processed substrate W that is placed on each of the substrate platforms PASS2, PASS4 (FIG. 11) to the carrier 113.

In the coating block 12, the transport mechanism 127 (FIG. 11) sequentially transports the unprocessed substrate W that is placed on the substrate platform PASS1 to the adhesion reinforcement processing unit PAHP (FIG. 7), the cooling unit CP (FIG. 7), and the coating processing chamber 22 (FIG. 2). Next, the transport mechanism 127 sequentially transports the substrate W in the coating processing chamber 22 to the thermal processing unit PHP (FIG. 7), the cooling unit CP (FIG. 7), the coating processing chamber 21 (FIG. 2), the thermal processing unit PHP (FIG. 7), and the substrate platform PASS5 (FIG. 11).

In this case, after the adhesion reinforcement processing is performed on the substrate W in the adhesion reinforcement processing unit PAHP, the substrate W is cooled in the cooling unit CP to a temperature suitable for the formation of the anti-reflection film. Next, in the coating processing chamber 22, an anti-reflection film is formed on the substrate W by the coating processing unit 129 (FIG. 2). Subsequently, after the thermal processing for the substrate W is performed in the thermal processing unit PHP, the substrate W is cooled in the cooling unit CP to a temperature suitable for the formation of the resist film. Then, a resist film is formed on the substrate W by the coating processing unit 129 (FIG. 2) in the coating processing chamber 21. Thereafter, the thermal processing for the substrate W is performed in the thermal processing unit PHP, and the substrate W is placed on the substrate platform PASS5.

Further, the transport mechanism 127 transports the substrate W after the development processing that is placed on the substrate platform PASS6 (FIG. 11) to the substrate platform PASS2 (FIG. 11).

The transport mechanism 128 (FIG. 11) sequentially transports the unprocessed substrate W that is placed on the substrate platform PASS3 to the adhesion reinforcement processing unit PAHP (FIG. 7), the cooling unit CP (FIG. 7), and the coating processing chamber 24 (FIG. 2). Next, the transport mechanism 128 sequentially transports the substrate W in the coating processing chamber 24 to the thermal processing unit PHP (FIG. 7), the cooling unit CP (FIG. 7), the coating processing chamber 23 (FIG. 2), the thermal processing unit PHP (FIG. 7), and the substrate platform PASS7 (FIG. 11).

Further, the transport mechanism 128 (FIG. 11) transports the substrate W after the development processing that is placed on the substrate platform PASS8 (FIG. 11) to the substrate platform PASS4 (FIG. 11). The contents of processing for the substrate W in the coating processing chambers 23, 24 (FIG. 2) and the lower thermal processing section 302 (FIG. 7) are respectively similar to the contents of processing for the substrate W in the above-mentioned coating processing chambers 21, 22 (FIG. 2) and the upper thermal processing section 301 (FIG. 7).

In the development block 13, the transport mechanism 137 (FIG. 11) sequentially transports the substrate W after the formation of the resist film that is placed on the substrate platform PASS5 to the edge exposure unit EEW (FIG. 7) and the placement buffer unit P-BF1 (FIG. 11). In this case, in the edge exposure unit EEW, the state detection processing and the edge exposure processing are performed on the substrate W. The substrate W after the edge exposure processing is placed on the placement buffer unit P-BF1.

Further, the transport mechanism 137 (FIG. 11) takes out the substrate W after exposure processing and the thermal processing from the thermal processing unit PHP (FIG. 7) adjacent to the interface block 14. The transport mechanism 137 sequentially transports the substrate W to the cooling unit CP (FIG. 7) and one of the development processing chambers 31, 32 (FIG. 2), then the thermal processing unit PHP (FIG. 7), and the substrate platform PASS6 (FIG. 11).

In this case, after the substrate W is cooled in the cooling unit CP to a temperature suitable for the development processing, the development processing for the substrate W is performed by the development processing unit 139 in any one of the development processing chambers 31, 32. Thereafter, the thermal processing for the substrate W is performed in the thermal processing unit PHP, and the substrate W is placed on the substrate platform PASS6.

The transport mechanism 138 (FIG. 11) sequentially transports the substrate W after the formation of the resist film that is placed on the substrate platform PASS7 to the edge exposure unit EEW (FIG. 7), and the placement buffer unit P-BF2 (FIG. 11).

Further, the transport mechanism 138 (FIG. 11) takes out the substrate W after the exposure processing and the thermal processing from the thermal processing unit PHP (FIG. 7) adjacent to the interface block 14. The transport mechanism 138 sequentially transports the substrate W to the cooling unit CP (FIG. 7), any one of the development processing chambers 33, 34 (FIG. 2), then the thermal processing unit PHP (FIG. 7), and the substrate platform PASS8 (FIG. 11). The contents of processing for the substrate W in the development processing chambers 33, 34, and the lower thermal processing section 304 are respectively similar to the contents of processing for the substrate W in the above-mentioned development processing chambers 31, 32, and the upper thermal processing section 303.

In the cleaning drying processing block 14A, the transport mechanism 141 (FIG. 1) sequentially transports the substrate W that is placed on each of the placement buffer units P-BF1, P-BF2 (FIG. 11) to the cleaning drying processing unit SD1 (FIG. 2) and the placement cooling unit P-CP (FIG. 11). In this case, after cleaning and drying processing for the substrate W are performed in the cleaning drying processing unit SD1, the substrate W is cooled to a temperature suitable for the exposure processing by the exposure device 15 (FIG. 1) in the placement cooling unit P-CP.

The transport mechanism 142 (FIG. 1) sequentially transports the substrate W after the exposure processing that is placed on the substrate platform PASS9 (FIG. 11) to the cleaning drying processing unit SD2 (FIG. 7), and the thermal processing unit PHP (FIG. 7) in the upper thermal processing section 303 or the lower thermal processing unit 304. In this case, after cleaning and drying processing for the substrate W are performed in the cleaning drying processing unit SD2, the exposure bake (PEB) processing is performed in the thermal processing unit PHP.

In the carry-in carry-out block 14B, the transport mechanism 146 (FIG. 1) transports the substrate W before the exposure processing that is placed on the placement cooling unit P-CP (FIG. 11) to the exposure device 15 (FIG. 1). Further, the transport mechanism 146 (FIG. 1) takes out the substrate W after the exposure processing from the exposure device 15 (FIG. 1), and transports the substrate W to the substrate platform PASS9 (FIG. 11).

(12) Effects

In the substrate processing apparatus 100 according to the present embodiment, based on the pieces of schedule management information 422 stored in the storage 420, the relationship between the orientation of the substrate W held by the spin chuck 25 at the time of carrying of the substrate W into the coating processing unit 129, and the orientation of the substrate W held by the substrate rotation unit 540 at the time of carrying of the substrate W into the edge exposure unit EEW is specified. Therefore, even in the case where the orientation of the substrate W held by the spin chuck 25 at the time of carrying of the substrate W into the coating processing unit 129, and the orientation of the substrate W held by the substrate rotation unit 540 at the time of carrying of the substrate W into the edge exposure unit EEW do not coincide with each other, the carry-in operation of the substrate W to the coating processing unit 129 by each of the transport mechanisms 127, 128 can be adjusted such that the center of the substrate W coincides with the rotation center of the spin chuck 25. As a result, the rotation center of the substrate W and the geometric center of the substrate W can easily coincide with each other.

(13) Other Embodiments (a) While the processing for removing the anti-reflection liquid or the resist liquid applied to the peripheral portion of the substrate W is performed as the substrate processing in the above-mentioned embodiment, the present invention is not limited to this. Processing for forming a film of a processing liquid at the peripheral portion of the substrate W may be performed as the substrate processing.

For example, contaminants are sometimes likely to adhere to the peripheral portion of the substrate W due to the roughness of the surface at the peripheral portion of the substrate W. In such a case, the peripheral portion of the substrate W is coated by the formation of the film of the processing liquid at the peripheral portion of the substrate W. Thus, an adherence of contaminants to the peripheral portion of the substrate W can be prevented.

(b) While the encoder is not provided in the substrate rotation unit 540 of the edge exposure unit EEW in the above-mentioned embodiment, the present invention is not limited to this. The encoder may be provided in the substrate rotation unit 540. In this case, the substrate rotation unit 540 is controlled such that the substrate W makes a full revolution based on the rotation angle of the substrate rotation unit 540 detected by the encoder with no detection of the position of the notch NT of the substrate W.

(c) While the CCD line sensor 583 is provided in the state detection processing unit 580 as the position detector in the above-mentioned embodiment, the present invention is not limited to this. A two-dimensional sensor that is arranged as the position detector such that an arrangement direction of pixels extends in the X direction and the Y direction may be provided in the state detection processing unit 580. In the case where the detection region of the position detector is larger than the measurement of the substrate W, the substrate W does not have to be rotated during the state detection processing.

(d) While the state detection processing unit 580 is provided in the edge exposure unit EEW in the development block 13 in the above-mentioned embodiment, the invention is not limited to this. The state detection processing unit 580 may be provided in another block such as the coating block 12 or the interface block 14, for example, and may be provided in another unit such as the development processing unit 139.

Further, a macro inspection device that inspects the surface state of the substrate may be provided as the state detection processing unit 580. In this case, a CCD camera of a macro inspection device picks up an image of the surface of the substrate W. Each of the edge cut widths D1, D2 is calculated based on the picked image of the surface of the substrate W.

(e) In the coating processing of the above-mentioned embodiment, a metal component may be included in the anti-reflection liquid or the resist liquid. In this case, in order to prevent the metal component from remaining at the peripheral portion of the substrate W, a removal liquid having alkaline property or acidic property that removes the metal component may be discharged to the peripheral portion of the substrate W.

(14) Correspondences Between Constituent Elements in Claims and Parts in Preferred Embodiments In the following paragraphs, non-limiting examples of correspondences between various elements recited in the claims below and those described above with respect to various preferred embodiments of the present invention are explained.

In the above-mentioned embodiment, the substrate W is an example of a substrate, the transport mechanisms 127, 128, 137, 138 are examples of a transport robot, and the coating processing unit 129 is an example of a substrate processor. The state detection processing unit 580 is an example of a detector, and the pieces of schedule management information 422 are examples of pieces of schedule management information, and the controller 410 is an example of a controller. The spin chuck 25 is an example of a rotation holder, the edge rinse nozzle 30 is an example of a processing liquid supplier, the substrate rotation unit 540 is an example of a substrate holder, and the CCD line sensor 583 is an example of a position detector and an image data detector.

The deviation amount calculator 413 is an example of a position deviation amount calculator, the deviation direction determiner 414 is an example of a position deviation direction determiner, the transport controller 411 is an example of an adjuster, and the substrate processing apparatus 100 is an example of a substrate processing apparatus. The processing controller 412 is an example of a rotation controller, the notch NT is an example of a position determiner, the processing liquid nozzle 28 is an example of a coating liquid supplier, and the edge exposure unit EEW is an example of a peripheral exposer.

As each of constituent elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

INDUSTRIAL APPLICABILITY

The present invention can be effectively utilized for various types of substrate processing.

I claim:

1. A substrate processing apparatus comprising:
   a transport robot that holds and transports a substrate having an at least partially circular outer periphery;
   a substrate processor that performs processing on the substrate using a processing liquid;
   a detector that detects a state of the substrate; and
   a controller that controls operations of the transport robot, the substrate processor and the detector, based on pieces of schedule management information including a transport path of the substrate by the transport robot and contents of processing for the substrate, wherein
   the transport robot transports the substrate along the transport path, carries in the substrate to the substrate processor, carries out the substrate after processing from the substrate processor, and carries in the substrate after processing by the substrate processor to the detector,
   the substrate processor includes
   a rotation holder that holds and rotates the substrate carried in by the transport robot, and
   a processing liquid supplier that performs processing on an annular region of one surface by supplying the processing liquid to a peripheral portion of the one surface of the substrate rotated by the rotation holder,
   the detector includes
   a substrate holder that holds the substrate carried in by the transport robot, and
   a position detector that detects a position of a peripheral edge of the substrate held by the substrate holder and a position of an inner edge of the annular region of the substrate held by the substrate holder,
   the controller includes
   a position deviation amount calculator that calculates a position deviation amount of a center of the substrate held by the rotation holder from a rotation center of the rotation holder, based on the position of the peripheral edge of the substrate detected by the position detector and the position of the inner edge of the annular region of the substrate detected by the position detector, a position deviation direction determiner that specifies a relationship between an orientation of the substrate held by the rotation holder at a time of carrying of the substrate into the substrate processor by the transport robot and an orientation of the substrate held by the substrate holder at a time of carrying of the substrate into the detector by the transport robot, based on the pieces of schedule management information, and determines a position deviation direction of the center of the substrate held by the rotation holder from the rotation center of the rotation holder, based on the specified relationship, and an adjustor that adjusts a carry-in operation of the substrate to the substrate processor by the transport robot such that a center of the substrate carried into the substrate processor after calculation of the position deviation amount and determination of the position deviation direction coincides with the rotation center of the rotation holder, based on the calculated position deviation amount and the determined position deviation direction.

2. The substrate processing apparatus according to claim 1, wherein the substrate holder is configured to hold and rotate the substrate in a horizontal attitude, the controller further includes a rotation controller that controls the substrate holder such that the substrate held by the substrate holder makes at least a full revolution, and the position detector detects the position of the peripheral edge of the substrate rotated by the substrate holder and the position of the inner edge of the annular region of the substrate rotated by the substrate holder.

3. The substrate processing apparatus according to claim 2, wherein a position determiner for specifying an orientation of the substrate is formed at the substrate, the position detector detects a position of the position determiner of the substrate, and the rotation controller controls a rotation angle of the substrate holder based on a change of the position of the position determiner of the substrate detected by the position detector.

4. The substrate processing apparatus according to claim 2, the position detector includes an image data detector that detects pieces of image data indicating the position of the peripheral edge of the substrate rotated by the substrate holder and the position of the inner edge of the annular region of the substrate rotated by the substrate holder, and the position deviation amount calculator detects a change of the position of the peripheral edge of the substrate in a radial direction of the substrate and a change of the position of the inner edge of the annular region of the substrate in the radial direction of the substrate, based on the pieces of image data detected by the image data detector, and calculates the position deviation amount of the center of the substrate, based on the detected change of the position of the peripheral edge of the substrate and the detected change of the position of the inner edge of the annular region of the substrate.

5. The substrate processing apparatus according to claim 4, wherein the position deviation amount calculator calculates a width of the annular region in the radial direction of the substrate, based on the change of the position of the peripheral edge of the substrate in the radial direction of the substrate and the change of the position of the inner edge of the annular region of the substrate in the radial direction of the substrate, and calculates the position deviation amount of the center of the substrate, based on the calculated width.

6. The substrate processing apparatus according to claim 1, wherein the substrate processor further includes a coating liquid supplier that supplies a coating liquid for forming a coating film on the substrate rotated by the rotation holder, the processing liquid supplier supplies a removal liquid that removes the coating liquid on the substrate supplied by the coating liquid supplier to the peripheral portion of the one surface of the substrate as the processing liquid, and the annular region is an annular region from which the coating liquid on the substrate is removed.

7. The substrate processing apparatus according to claim 6, wherein the coating liquid supplier supplies a coating liquid for forming a photosensitive coating film, the substrate processing apparatus further includes a peripheral exposer that exposes the coating film at the peripheral portion of the one surface of the substrate, the coating film being formed by the coating liquid supplier, and the detector is provided at the peripheral exposer.

8. The substrate processing apparatus according to claim 1, wherein the processing liquid supplier supplies a coating liquid for forming a coating film on the substrate to the peripheral portion of the one surface of the substrate as the processing liquid, and the annular region is an annular region on which the coating film is formed on the substrate.

* * * * *